US009495312B2

(12) United States Patent
Ganfield et al.

(10) Patent No.: US 9,495,312 B2
(45) Date of Patent: Nov. 15, 2016

(54) DETERMINING COMMAND RATE BASED ON DROPPED COMMANDS

(71) Applicant: INTERNATIONAL BUSINESS MACHINES CORPORATION, Armonk, NY (US)

(72) Inventors: Paul A. Ganfield, Rochester, MN (US); Guy L. Guthrie, Austin, TX (US); John T. Hollaway, Jr., Austin, TX (US); David J. Krolak, Rochester, MN (US); Charles F. Marino, Round Rock, TX (US); Praveen S. Reddy, Austin, TX (US); Michael S. Siegel, Raleigh, NC (US); William J. Starke, Round Rock, TX (US); Jeffrey A. Stuecheli, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 289 days.

(21) Appl. No.: 14/136,958

(22) Filed: Dec. 20, 2013

(65) Prior Publication Data
US 2015/0178230 A1 Jun. 25, 2015

(51) Int. Cl.
G06F 3/00 (2006.01)
G01R 31/08 (2006.01)
G06F 13/36 (2006.01)
G06F 13/40 (2006.01)

(52) U.S. Cl.
CPC ............... *G06F 13/36* (2013.01); *G01R 31/08* (2013.01); *G06F 3/00* (2013.01); *G06F 13/4068* (2013.01); *Y02B 60/1228* (2013.01); *Y02B 60/1235* (2013.01)

(58) Field of Classification Search
USPC ...... 710/29, 34, 60, 110, 305; 370/229, 230, 370/230.1, 232, 235, 236
See application file for complete search history.

(56) References Cited

U.S. PATENT DOCUMENTS

| | | | |
|---|---|---|---|
| 5,367,523 A * | 11/1994 | Chang et al. ................ | 370/235 |
| 6,178,448 B1 * | 1/2001 | Gray et al. .................... | 709/224 |
| 6,516,379 B1 * | 2/2003 | Deshpande et al. .......... | 710/310 |
| 6,628,610 B1 * | 9/2003 | Waclawsky et al. ......... | 370/229 |
| 6,968,431 B2 * | 11/2005 | Mayfield ....................... | 711/146 |

(Continued)

OTHER PUBLICATIONS

Ganfield et al. "Determining Command Rate Based on Dropped Commands", U.S. Appl. No. 14/311,467, Non-Final Office Action dated Dec. 12, 2015.

(Continued)

*Primary Examiner* — Khanh Dang
(74) *Attorney, Agent, or Firm* — Brian F. Russell; Steven L. Bennett

(57) ABSTRACT

In one or more embodiments, one or more systems, devices, methods, and/or processes described can send, via an interconnect, a rate master command to at least one of multiple processing nodes; determine that a message indicating a dropped command, associated with the rate master command, is received; determine that a count, associated with dropped commands, satisfies a threshold; and provide, to the processing nodes via the interconnect, a signal indicating a command rate, in response to determining that the count satisfies the threshold. Moreover, the count can be incremented in response to determining that the message is received. The at least one of multiple processing nodes can receive, via the interconnect, the signal indicating the command rate and can utilize the command rate in issuing speculative commands, via the interconnect.

15 Claims, 17 Drawing Sheets

(56) References Cited

U.S. PATENT DOCUMENTS

| | | | |
|---|---|---|---|
| 7,492,710 B2* | 2/2009 | Wadekar et al. | 370/230 |
| 8,531,960 B2* | 9/2013 | Berly et al. | 370/235 |
| 8,576,709 B2* | 11/2013 | Yang | 370/230 |
| 2003/0101297 A1* | 5/2003 | Allen et al. | 710/107 |
| 2004/0196852 A1* | 10/2004 | Aksu et al. | 370/395.21 |
| 2007/0130410 A1* | 6/2007 | Keller et al. | 710/310 |
| 2007/0206497 A1* | 9/2007 | Plamondon et al. | 370/231 |
| 2008/0151919 A1* | 6/2008 | Li et al. | 370/412 |
| 2010/0036984 A1 | 2/2010 | Goodman et al. | |
| 2012/0131309 A1 | 5/2012 | Johnson et al. | |
| 2012/0311272 A1 | 12/2012 | Blumrich et al. | |
| 2012/0311299 A1 | 12/2012 | Blumrich et al. | |
| 2013/0205098 A1 | 8/2013 | Guthrie et al. | |
| 2013/0205099 A1 | 8/2013 | Guthrie et al. | |
| 2013/0205121 A1 | 8/2013 | Guthrie et al. | |
| 2015/0029863 A1* | 1/2015 | Lai | 370/237 |

OTHER PUBLICATIONS

Ganfield et al. "Determining Command Rate Based on Dropped Commands", U.S. Appl. No. 14/311,467, Final Office Action dated May 3, 2016.

Ganfield et al. "Determining Command Rate Based on Dropped Commands", U.S. Appl. No. 14/311,467, Notice of Allowance dated Jul. 20, 2016.

* cited by examiner

DETERMINING COMMAND RATE BASED ON DROPPED COMMANDS

BACKGROUND

This disclosure relates generally to data processing and more specifically to communication in a multiprocessor data processing system.

Broadly speaking, memory coherence in symmetric multiprocessing (SMP) systems can be maintained either by a directory-based coherency protocol in which coherence is resolved by reference to one or more memory directories or by a snooping-based coherency protocol in which coherence is resolved by message passing between caching agents. As SMP systems scale to ever-larger n-way systems, snooping coherency protocols become subject to at least two design constraints, namely, a limitation on the depth of queuing structures within the caching agents utilized to track requests and associated coherence messages and a limitation in the communication bandwidth available for message passing.

To address the limitation on the depth of queuing structures within the caching agents, some designs have adopted non-blocking snooping protocols that do not require caching agents to implement message tracking mechanisms, such as message queues. Instead, in non-blocking snooping protocols, caching agents' requests are temporally bounded (meaning snoopers will respond within a fixed time) and are source throttled (to ensure a fair division of available communication bandwidth). For example, the total system bandwidth can be divided evenly (e.g., via time-division multiplexing) amongst all possible processing nodes in the system to ensure the coherency buses have sufficient bandwidth in a worst-case scenario when all processing nodes are issuing requests. However, equal allocation of coherency bus bandwidth in this manner limits the coherency bandwidth available to any particular processing nodes to no more than a predetermined subset of the overall available coherency bandwidth. Furthermore, coherency bandwidth of the system can be under-utilized when only a few processing nodes require high bandwidth.

BRIEF SUMMARY

In one or more embodiments, one or more systems, devices, methods, and/or processes described can send, via an interconnect, a rate master command to at least one of multiple processing nodes; determine that a message indicating a dropped command, associated with the rate master command, is received; determine that a count, associated with dropped commands, satisfies a threshold; and provide, to the processing nodes via the interconnect, a signal indicating a command rate, in response to determining that the count satisfies the threshold. Moreover, the count can be incremented in response to determining that the message is received. The at least one of multiple processing nodes can receive, via the interconnect, the signal indicating the command rate and can utilize the command rate in issuing speculative commands, via the interconnect.

BRIEF DESCRIPTION OF THE SEVERAL VIEWS OF THE DRAWINGS

The embodiments will become apparent upon reading the following detailed description and upon reference to the accompanying drawings as follows.

DETAILED DESCRIPTION

In one or more embodiments, systems, methods, and/or processes described herein can provide and/or implement a fabric controller (FBC) that can be utilized with a scalable cache-coherent multiprocessor system. For example, the FBC can provide coherent and non-coherent memory access, input/output (I/O) operations, interrupt communication, and/or system controller communication, among others. For instance, the FBC can provide interfaces, buffering, and sequencing of command and data operations within one or more of a storage system and a storage subsystem, among others.

In one or more embodiments, a FBC link can be or include a split transaction, multiplexed command and data bus that can provide support for multiple processing nodes (e.g., a hardware implementation of a number of multiprocessor units). For example, a FBC link can provide support for multiple processor units.

In one or more embodiments, cache coherence can be maintained and/or achieved by utilizing a non-blocking snoop-based coherence protocol. For example, an initiating processing node (e.g., a hardware implementation of a multiprocessor unit) can broadcast commands to snoopers, snoopers can return coherence responses (e.g., in-order) to the initiating processing node, and a combined snoop response can be broadcast back to the snoopers. In one or more embodiments, multiple levels (e.g., scopes) of snoop filtering (e.g., Node, Group, RemoteGroup, System, etc.) can be supported to take advantage of locality of data and/or processing threads. For example, this approach can reduce a required amount of interlink bandwidth, can reduce bandwidth needed for system wide command broadcasts, and/or can maintain hardware enforced coherency using a snoop-based coherence protocol.

In one or more embodiments, a so-called "NodeScope" is a transaction limited in scope to snoopers within a single integrated circuit chip (e.g., a single processor unit or processing node), and a so-called "GroupScope" is a transaction limited in scope to a command broadcast scope to snoopers found on a physical group of processing nodes. If a transaction cannot be completed coherently using a more limited broadcast scope (e.g., a Node or Group), the snoop-based coherence protocol can compel a command to be reissued to additional processing nodes of the system (e.g., a Group or a System that includes all processing nodes of the system).

Figure 1:
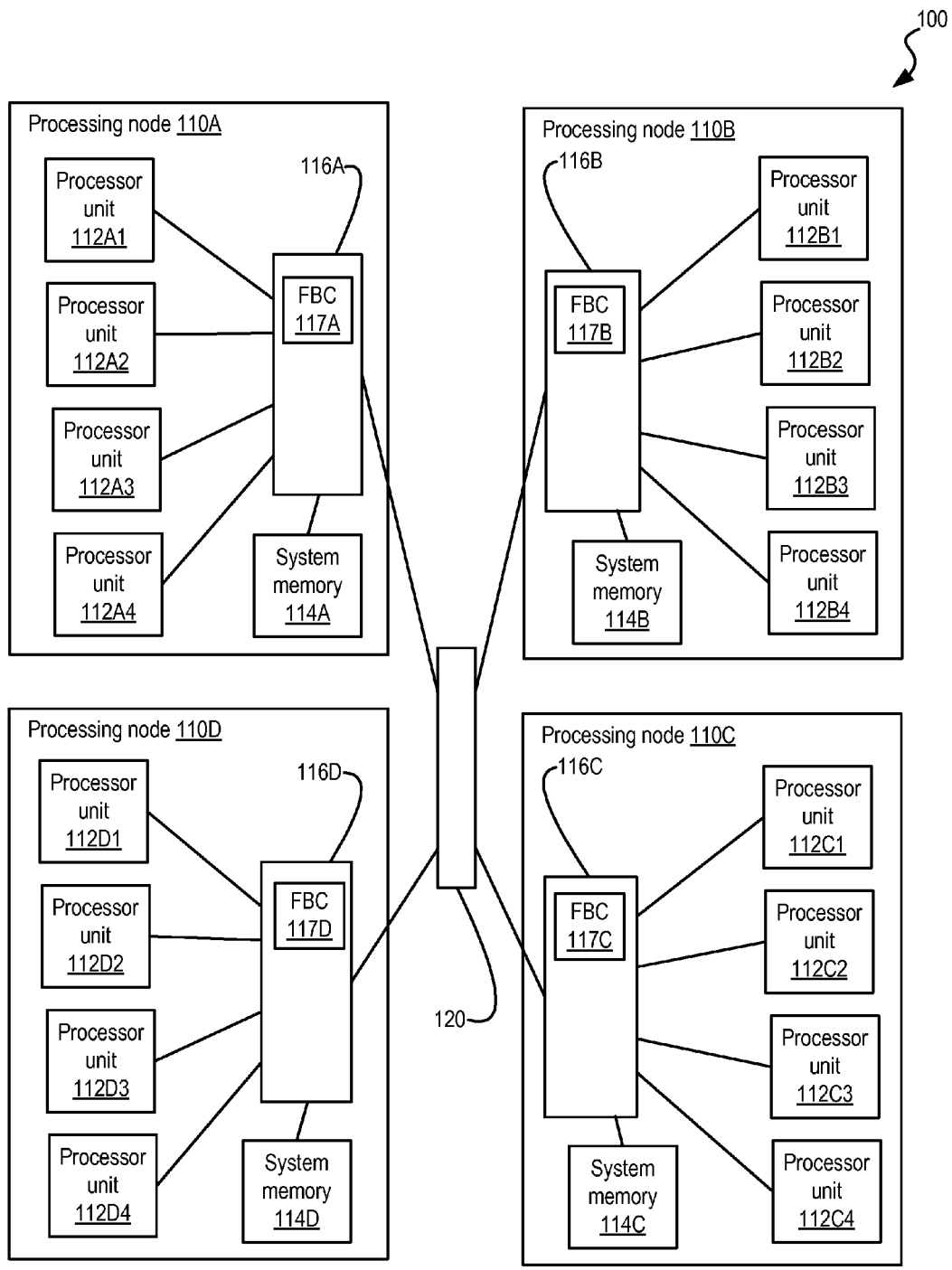
FIG. 1 provides an exemplary data processing system, according to one or more embodiments.

Turning now to FIG. 1, an exemplary data processing system 100 is illustrated, according to one or more embodiments. As shown, data processing system 100 includes processing nodes 110A-110D that can be utilized in processing data and/or instructions. In one or more embodiments, data processing system 100 can be or include a cache coherent symmetric multiprocessor (SMP) data processing system. As illustrated, processing nodes 110A-110D are coupled to a system interconnect 120 (e.g., an interconnect fabric) that can be utilized in conveying address, data, and control information. System interconnect 120 can be implemented, for example, as a bused interconnect, a switched interconnect and/or a hybrid interconnect, among others.

In one or more embodiments, each of processing nodes 110A-110D can be realized as a multi-chip module (MCM) including multiple processor units 112, in which each of processor units 112A1-112D4 can be realized as an integrated circuit chip. As shown, processing node 110A can include processor units 112A1-112A4 and a system memory 114A; processing node 110B can include processor units 112B1-112B4 and a system memory 114B; processing node 110C can include processor units 112C1-112C4 and a system memory 114C; and processing node 110D can include processor units 112D1-112D4 and system memory 114D. In one or more embodiments, system memories 114A-114D include shared system memories and can generally be read from and written to by any processor unit 112 of data processing system 100.

As illustrated, each of processing nodes 110A-110D can include respective interconnects 116A-116D that can be communicatively coupled directly or indirectly to interconnect 120. As shown, processor units 112A1-112A4 and system memory 114A can be coupled to interconnect 116A (e.g., an interconnect fabric), processor units 112B1-112B4 and system memory 114B can be coupled to interconnect 116B (e.g., an interconnect fabric), processor units 112C1-112C4 and system memory 114C can be coupled to interconnect 116C (e.g., an interconnect fabric), and processor units 112D1-112D4 and system memory 114D can be coupled to interconnect 116D (e.g., an interconnect fabric).

In one or more embodiments, processor units 112A1-112D4, included in respective processing nodes 110, can be coupled for communication to each other. In one example, processor units 112A1-112A4, can communicate with other processor units via interconnect 116A and/or interconnect 120. In a second example, processor units 112B1-112B4, can communicate with other processor units via interconnect 116B and/or interconnect 120. In a third example, processor units 112C1-112C4, can communicate with other processor units via interconnect 116C and/or interconnect 120. In another example, processor units 112D1-112D4, can communicate with other processor units via interconnect 116D and/or interconnect 120.

In one or more embodiments, an interconnect (e.g., interconnects 116A, 116B, 116C, 116D, 120, etc.) can include a network topology where nodes can be coupled to one another via network switches, crossbar switches, etc. For example, an interconnect can determine a physical broadcast, where processing nodes snoop a command in accordance with a coherency scope, provided by a processor unit.

In one or more embodiments, data processing system 100 can include additional components, that are not illustrated, such as interconnect bridges, non-volatile storage, ports for connection to networks, attached devices, etc. For instance, such additional components are not necessary for an understanding of embodiments described herein, they are not illustrated in FIG. 1 or discussed further. It should also be understood, however, that the enhancements provided by this disclosure are applicable to cache coherent data processing systems of diverse architectures and are in no way limited to the generalized data processing system architecture illustrated in FIG. 1.

Figure 2:
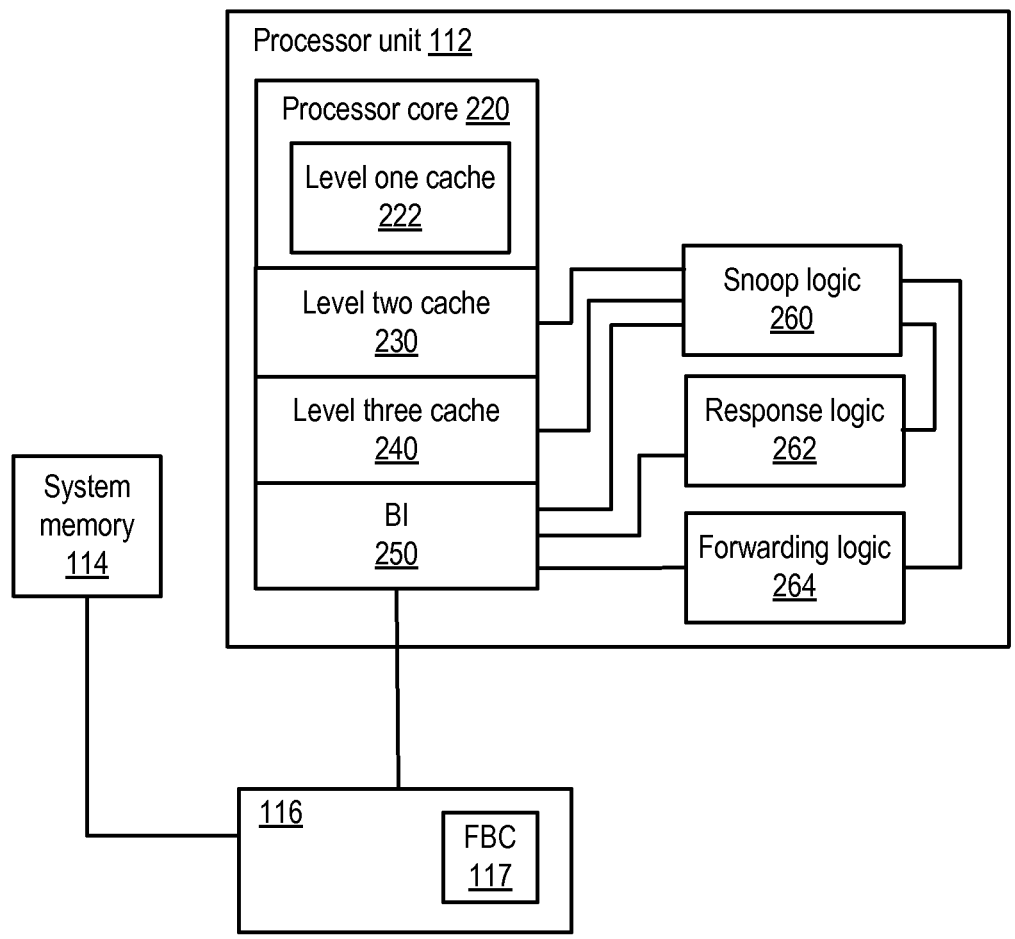
FIG. 2 provides an exemplary processor unit, according to one or more embodiments.

Turning now to FIG. 2, an exemplary processor unit 112 is illustrated, according to one or more embodiments. As shown, processor unit 112 can include one or more processor cores 220 that execute instructions of a selected instruction set architecture (ISA). In one or more embodiments, operation of processor core 220 can be supported by a multi-level volatile memory hierarchy having at its lowest level shared system memory 114, and at its upper levels, two or more levels of cache memory that can cache data and/or instructions residing within cacheable addresses. In one or more embodiments, the cache memory hierarchy of each processor core 220 includes a respective store-through level one (L1) cache 222 within and private to processor core 220, a store-in level two (L2) cache 230 private to processor core 220, and a possibly shared level three (L3) victim cache 240 that can buffer L2 castouts.

As shown, processor unit 112 is coupled to interconnect 116 via a bus interface (BI) 250. For example, processor unit 112 can communicate information with other processor units 112 and system memories 114 via BI 250 and interconnect 116. In one instance, the information can include a command requesting data. In another instance, the information can include a coherence response associated with such a request. In another instance, the information can include data associated with such a request. As illustrated, interconnect 116 can include a FBC 117.

As shown, processor unit 112 can further include snoop logic 260, response logic 262, and forwarding logic 264. Snoop logic 260, which can be coupled to or form a portion of L2 cache 230 and L3 cache 240, can be responsible for determining the individual coherence responses and actions to be performed in response to requests snooped on interconnect 116. Response logic 262 can be responsible for determining a combined response for a request issued on interconnect 116 based on individual coherence responses received from recipients of the request. Additionally, forwarding logic 264 can selectively forward communications between its local interconnect 116 and a system interconnect (e.g., interconnect 120 of FIG. 1, interconnect 330 of FIG. 3E, etc.).

Turning now to FIGS. 3A-3E, command and response data flows in a data processing system 300 are illustrated, according to one or more embodiments. FIGS. 3A-3D together illustrate command and response flows for a SystemScope reaching all processing units of data processing system 300. As illustrated in FIGS. 3A-3E, data processing system 300 can include multiple multiprocessing (MP) systems 310A-310D. MP system 310A in turn includes processing nodes 310A1-310A4, MP system 310B includes processing nodes 310B1-310B4, MP system 310C includes processing nodes 310C1-310C4, and MP system 310D includes processing nodes 310D1-310D4. In one or more embodiments, each of MP systems 310A-310D can include one or more data processing systems 100 as shown in FIG. 1.

In one or more embodiments, cache coherency can be maintained and/or achieved in data processing system 300 by reflecting command packets to all processor units in a MP system and/or a group of MP systems. Each processor unit that receives reflected commands (e.g., command messages) can send partial responses (e.g., partial response messages) that can include information associated with a state of a snooper, a processor unit of the snooper, and/or a cache line (if any and if specified by a transfer type) held within the processor unit of the snooper. In one or more embodiments, an order in which partial response messages are sent can match an order in which reflected commands are received.

Figure 3A:
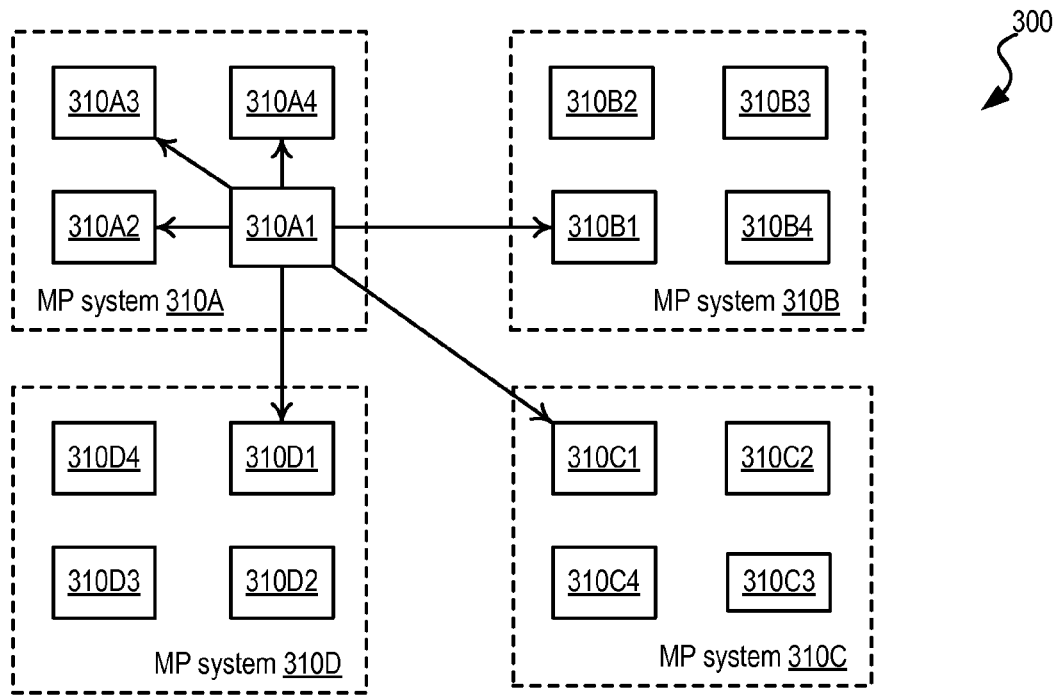
FIGS. 3A-3D provide command and response data flows in a data processing system, according to one or more embodiments.

As shown in FIG. 3A, processing node 310A1 can broadcast a command (request) to processing nodes 310B1, 310C1, 310D1 and 310A2-310A4. In one or more embodiments, processing nodes 310A1, 310B1, 310C1, and 310D1 can be or serve as master processing nodes of respective MP systems 310A-310D for one or more commands. In one or more embodiments, processing nodes 310B1, 310C1, and 310D1 can be hub nodes and/or remote nodes, and processing nodes 310B2-310B4, 310C2-310C4, and 310D2-310D4 can be leaf nodes. In one or more embodiments, processing nodes 310A2-310A4 can be near nodes.

Figure 3B:
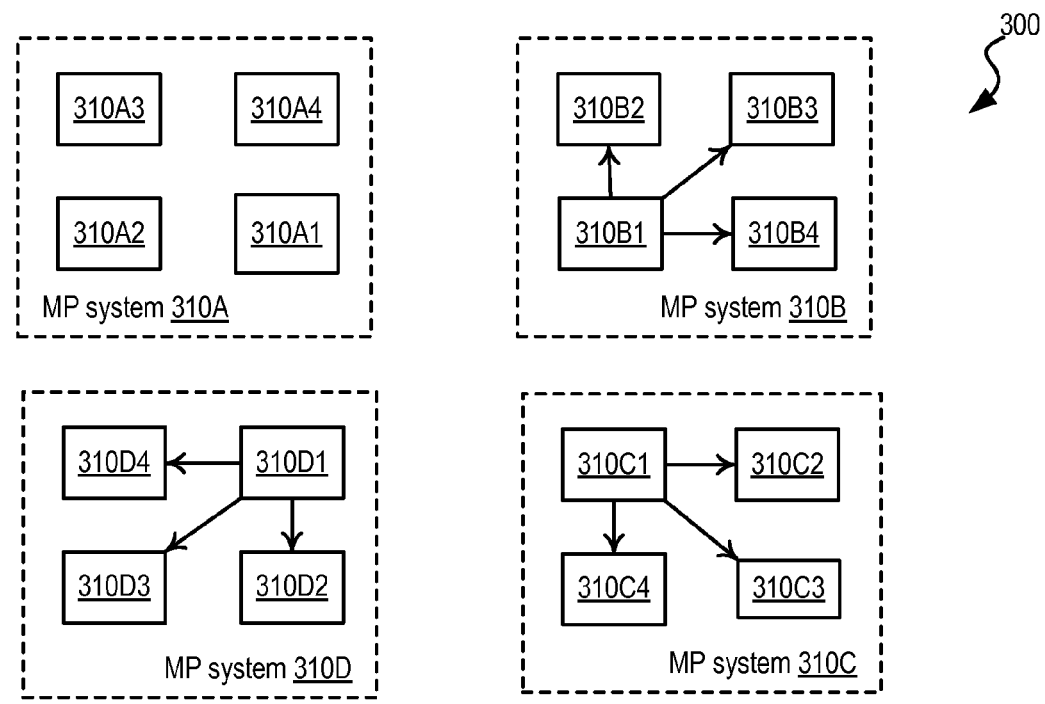

As illustrated in FIG. 3B, serving as master processing nodes for the command, processing node 310B1 can broadcast the command to the processing nodes 310B2-310B4 in its MP system 310B, processing node 310C1 can broadcast the command to the processing nodes 310C2-310C4 in its MP system 310C, and processing node 310D1 can broadcast the command to the processing nodes 310D2-310D4 in its MP system 310D.

Figure 3C:
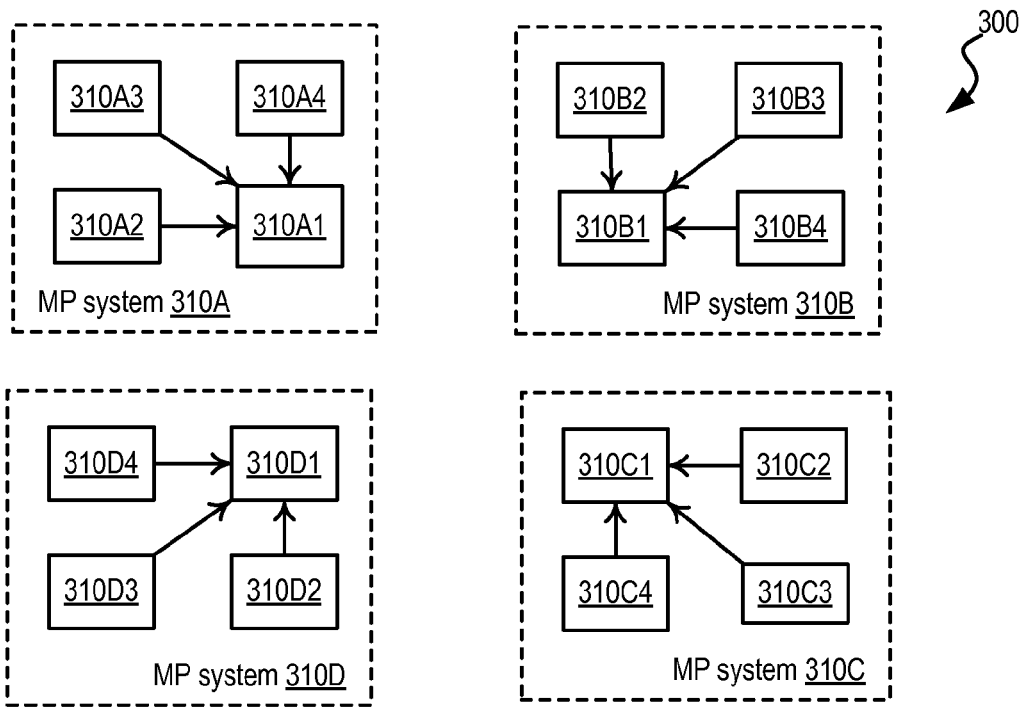

In one or more embodiments, processing nodes 310A2-310A4, 310B1-310B4, 310C1-310C4, and 310D1-310D4 can determine their respective individual coherence responses to the broadcasted command. As shown in FIG. 3C, processing nodes 310A2-310A4 can provide their respective responses to master processing node 310A1, processing nodes 310B2-310B4 can provide their respective responses to master processing node 310B1, processing nodes 310C2-310C4 can provide their respective responses to master processing node 310C1, and processing nodes 310D2-310D4 can provide their respective responses to master processing node 310D1. Because these coherence responses represent a response from only a subset of the scope that received the command, the coherence responses from processing nodes 310A2-310A4, 310B2-310B4, 310C2-310C4, and 310D2-310D4 can be referred to as partial responses, according to one or more embodiments.

Figure 3D:
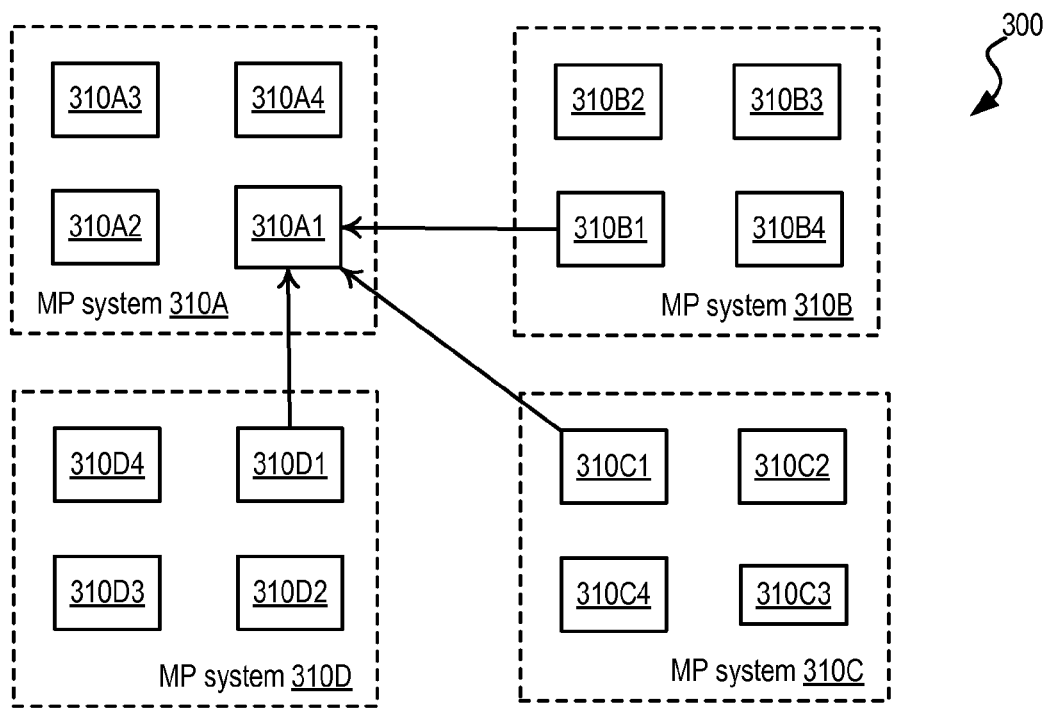

In one or more embodiments, processing nodes 310B1, 310C1, and 310D1 can combine received partial responses into respective accumulated partial responses. As illustrated in FIG. 3D, each of processing nodes 310B1, 310C1, and 310D1 can provide its accumulated partial response to processing node 310A1. After processing node 310A1 receives the accumulated partial responses, processing node 310A1 can combine the accumulated partial responses into a combined response.

In one or more embodiments, an interconnect bus can be over-utilized (e.g., as discussed below with reference to FIG. 4), some commands can be dropped, and a partial response (e.g., a response of a reflected command that indicates a drop: "rty_dropped_rcmd") can be returned for that processing node or a group of processing nodes. In one example, if a master processing node has exceeded a programmable threshold of retries then a mechanism and/or system can back-off command rates to allow one or more master processing nodes to make forward progress. In another example, when a first processing node has insufficient bandwidth to broadcast a command that the first processing node has received from a second processing node, the first processing node can return a retry partial response (e.g., a "rty_dropped_rcmd"). This response can indicate that the command was not broadcast to the first processing node or a group of processing nodes.

In one or more embodiments, a partial response can be combined with partial responses of other processing nodes, and the presence of a rty_dropped_rcmd may not necessarily cause a command to fail. For example, the command can still succeed even though it is not broadcast on all processing nodes in a system. For instance, as long as all required participating parties (e.g., HPC (highest point of coherency) and/or LPC (lowest point of coherency), etc.) are able to snoop and provide a non-retry partial response to a command, the operation can succeed.

An LPC is defined herein as a memory device or I/O device that serves as the repository for a memory block. In the absence of the existence of an HPC for the memory block, the LPC holds the true image of the memory block and has authority to grant or deny requests to generate an additional cached copy of the memory block. For a typical request in the data processing system embodiment of FIGS. 1-2, the LPC will be the memory controller for the system memory 114 holding the referenced memory block. An HPC is defined herein as a uniquely identified device that caches a true image of the memory block (which may or may not be consistent with the corresponding memory block at the LPC) and has the authority to grant or deny a request to modify the memory block, according to one or more embodiments. Descriptively, the HPC may also provide a copy of the memory block to a requestor in response to a command, for instance.

Figure 3E:
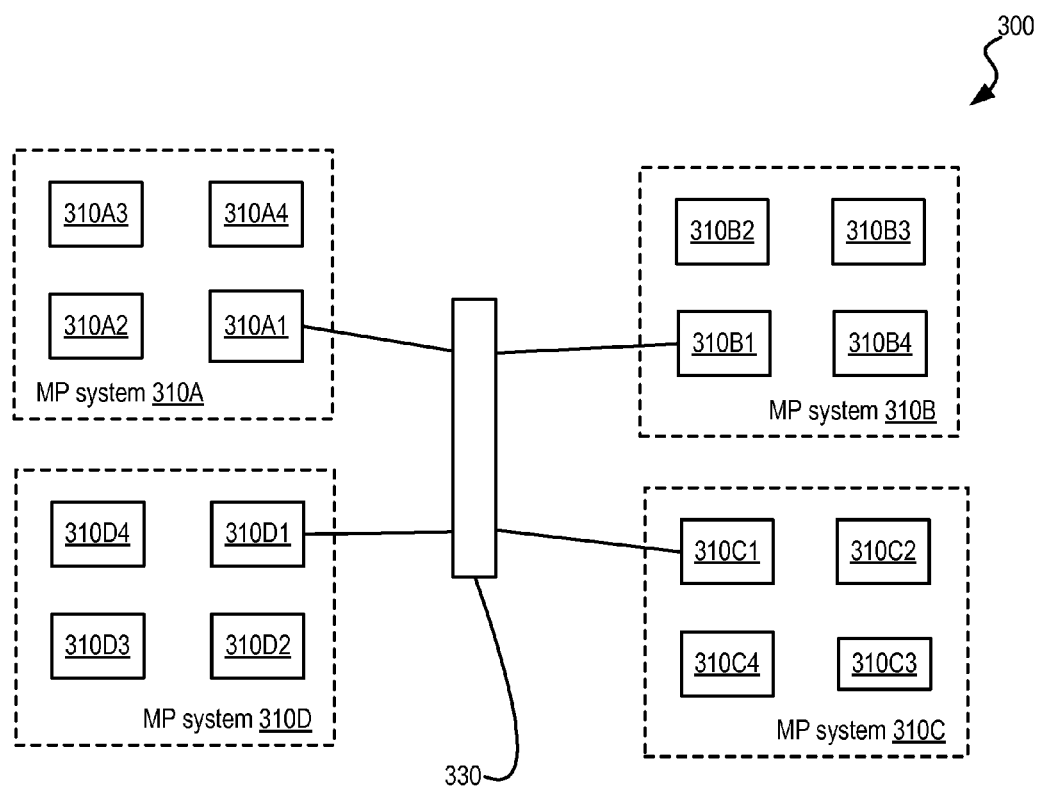
FIG. 3E provides an exemplary diagram of multiprocessing systems coupled to an interconnect, according to one or more embodiments.

For example, an L3 cache 240 of a processor unit 112 of processing node 310C can store first data, and a processor unit 112 of processing node 310A can request the first data via a broadcast command (which may have, for example, a System or Group scope of broadcast). If the L3 cache 240 is a highest point of coherency for the first data, L3 cache 240 can respond to the command of processing node 310A with a partial response indicating that it will provide the first data to the processor unit 112 of processing node 310A. Either prior to or in response to the combined response, processing node 310C can provide the first data to processing node 310A via an interconnect 330 that couples MP system 310A-310D as illustrated in FIG. 3E, according to one or more embodiments.

Similarly, in a second example, an L2 cache 230 of processor unit 112D3 (illustrated in FIG. 1) can store second data, and processor unit 112D4 can broadcast a request for the second data (where the request can be limited in scope to only processing node 110D (i.e., a NodeScope)). If processor unit 112D3 is the HPC or is designated by the HPC to do so, processor unit 112D3 can intervene the second data to processor unit 112D4, so that processor unit 112D4 has the benefit of a lower access latency (i.e., does not have to await for delivery of the second data from the LPC (i.e., system memory)). In this case, processor unit 112D4 broadcasts a command specifying the system memory address of the second data. In response to snooping the broadcast, processor unit 112D4 provides a partial response (e.g., to processor unit 112D3) that indicates that processor unit 112D4 can provide the second data. Thereafter, prior to or in response to the combined response, processor unit 112D4 provides the second data to processor unit 112D3 via L2 cache 230 and interconnect 116D.

In one or more embodiments, the participant that issued a command that triggered a retry combined response can (or in some implementations can be required to) reissue the same command in response to the retry combined response. In one or more embodiments, drop priorities can be utilized. For example, a drop priority can be specified as low, medium, or high. In one instance, commands associated with a low drop priority can be the first commands to be dropped or overcommitted, utilizing an overcommit protocol as described with reference to FIG. 5D, described below. In another instance, commands associated with a high drop priority can be the last commands to be dropped or overcommitted. In some embodiments, commands issued speculatively, such as data prefetch commands, can be associated with low drop priorities.

Figure 4:
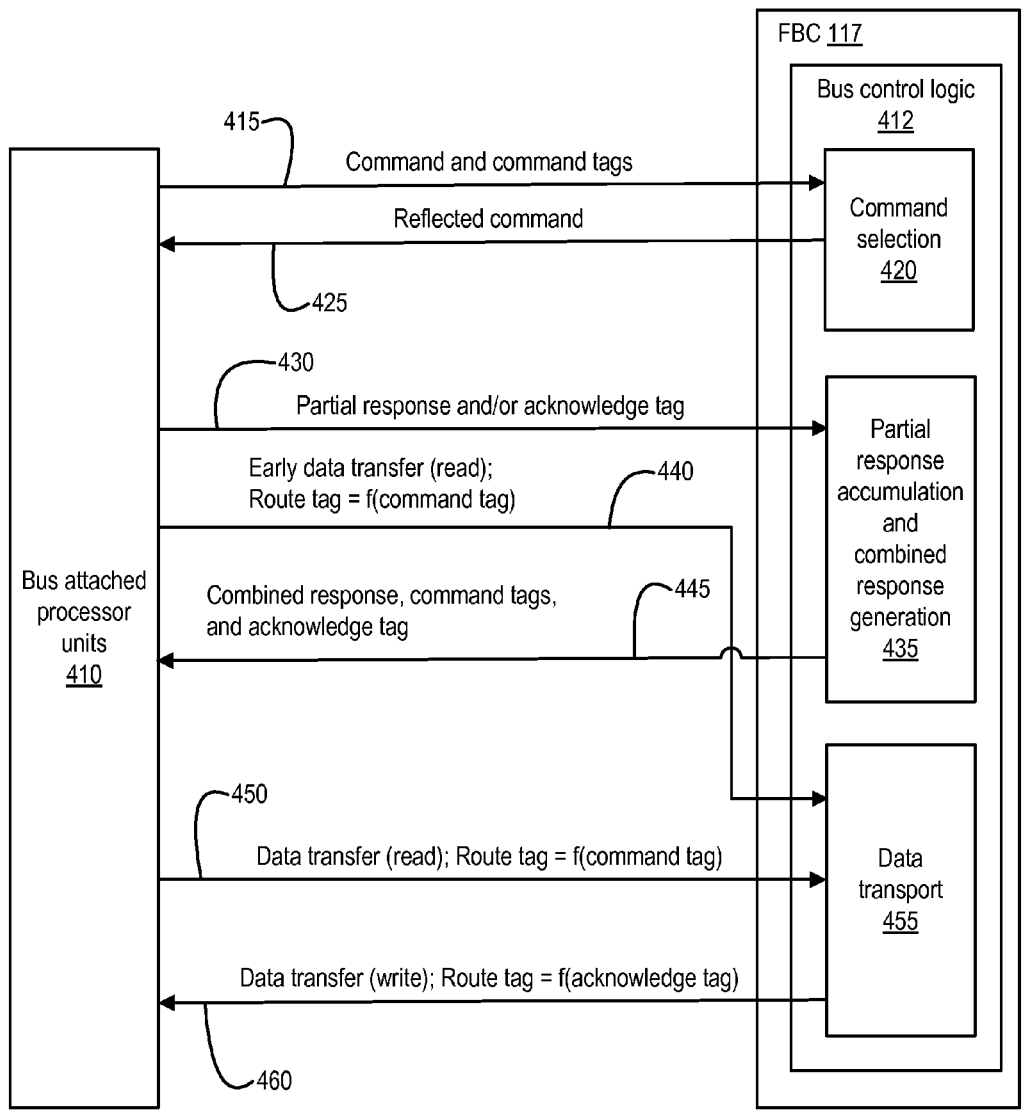
FIG. 4 provides an exemplary timing diagram that illustrates a command, a coherence response, and data delivery sequence, according to one or more embodiments.

Turning now to FIG. 4, an exemplary timing diagram that illustrates a command, a coherence response, and data delivery sequence is illustrated, according to one or more embodiments. As shown, bus attached processor units 410 can provide a command and command tags 515 to a command selection 420 of a bus control logic 412. For example, bus attached processor units 410 can be included in a transaction in a data processing system employing a snooped-based coherence protocol.

In one or more embodiments, a participant (e.g., a processor unit 112) coupled to an interconnect (e.g., a "master" of the transaction) can place a command 415 on a command interface of the interconnect. In one or more embodiments, a command 415 can specify a transaction type (tType), an identification of a requestor provided in a Transfer Tag (tTag), and optionally a target real address of a memory block to be accessed by the command.

Exemplary transaction types can include those set forth below in Table I, for instance.

TABLE I

| Type | Description |
| --- | --- |
| READ | Requests a copy of the image of a memory block for query purposes |
| RWITM (Read-With-Intent-To-Modify) | Requests a copy of the image of a memory block with the intent to update (modify) it and requires destruction of other copies, if any |
| DCLAIM (Data Claim) | Requests authority to promote an existing query-only copy of memory block to a unique copy with the intent to update (modify) it and requires destruction of other copies, if any |
| DCBZ (Data Cache Block Zero) | Requests authority to create a new unique cached copy of a memory block without regard to its present state and subsequently modify its contents; requires destruction of other copies, if any |
| CASTOUT | Copies the image of a memory block from a higher level of memory to a lower level of memory in preparation for the destruction of the higher level copy. A cast-in is a castout received from a higher level of cache memory. |
| WRITE | Requests authority to create a new unique copy of a memory block without regard to its present state and immediately copy the image of the memory block from a higher level memory to a lower level memory in preparation for the destruction of the higher level copy |
| PARTIAL WRITE | Requests authority to create a new unique copy of a partial memory block without regard to its present state and immediately copy the image of the partial memory block from a higher level memory to a lower level memory in preparation for the destruction of the higher level copy |

In one or more embodiments, bus control logic 412 can select a command from among possibly numerous commands presented by masters of a processing node and reflected commands received from other processing nodes as a next command to be issued. As shown, the command selected by command selection 420 (e.g., the control logic) is transmitted to other participants via the interconnect as a reflected command 425 after optional queuing.

In one or more embodiments, after an amount of time (e.g., $t_{snoop}$) following issuance of the reflected command, participants (e.g., snoopers) on the processing node can provide one or more of a partial response and/or an acknowledge tag 430. For example, an acknowledge tag is provided for write operations to indicate a location of the LPC (e.g., system memory 114). In one or more embodiments, bus control logic 412 can combine partial responses from processing nodes within an original broadcast scope of the command and can generate a combined response.

In one or more embodiments, for read operations, a participant that holds a copy of the target memory block in one of its caches can determine prior to receipt of a combined response of the command that it is a source of the target memory block. Consequently, this participant can transmit a copy of the target memory block toward the requestor prior to bus control logic 412 issuing a combined response for the command. Such an early data transfer is illustrated in FIG. 4 at reference numeral 440.

In one or more embodiments, a partial response accumulation and combined response generation 435 can specify that data routing is based on destination addressing, and an address included in the route tag specifies a destination of a participant that is to receive the data transfer. For example, the route tag can be derived from and/or based on a tTag. For instance, the route tag can include a processing node identification and/or a processor unit identification. In one or more embodiments, an order in which read data is returned to the master may not be in a command order. For example, a processor unit can be responsible for associating a data transfer with a command, since a route tag can be the same as an original command tag.

In one or more embodiments, the combined response, the original command tag, and the acknowledge tag can be sent to one or more snoopers of the processing node and queued for transmission to other processing nodes of the system, as shown at reference numeral 445. In one example, a combined response indicates a success or a failure of a transaction. The combined response may further indicate a coherence state transition for the target cache line at the master and/or other participants, as well as any subsequent action the master and/or other participants are to perform. For example, the snooping processor unit(s) that hold a copy of the target cache line and that were not able to determine if they are to provide the data based solely on the command and the coherence state of their copy of the target cache line, can examine the combined response to determine if they are designated by the HPC to provide the target cache line to the requestor by intervention.

FIG. 4 further illustrates a participant transmitting the target cache line requested by a read command at reference numeral 450. For example, a route tag, utilized by the participant transmitting the target cache line, can be derived from and/or based on the original command tTag. In one or more embodiments, an order in which the target cache line is returned to the master may not be in command order. The use of route tags derived from or including the original command tTag thus allows the requestor to match data delivered out-of-order with commands, for instance.

As illustrated, data transport 455 transfers write data 460 for a write command. For example, the route tag included in the data delivery of the write command can be derived from and/or based on an acknowledge tag that was provided by a participant that is to perform the write operation (e.g., a memory controller). In one or more embodiments, the order in which the target cache line of write data is provided to the participant may not be in command order. As above, the use of a route tag that includes or is based upon the acknowledge tag permits the participant to pair the delivered data with the write command, for example.

In one or more embodiments, systems, methods, and/or processes described herein can utilize an overcommit protocol that allows unused coherency bandwidth to be used by higher bandwidth masters. For example, systems, methods, and/or processes described herein can use under-utilized coherency bandwidth on a fabric interconnect and can allow a coherency master to transmit at a higher rate than one specified for a fixed time-division multiplexing system.

Figure 5A:
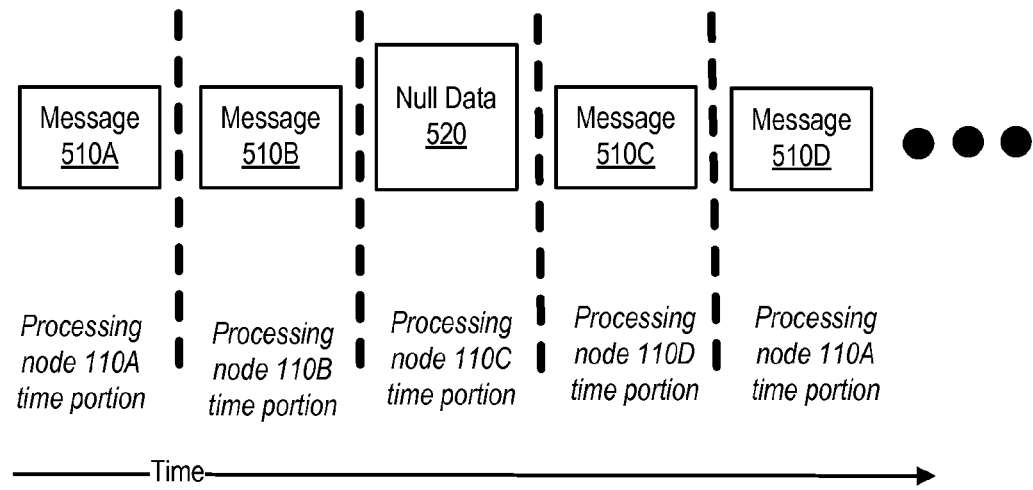
FIGS. 5A-5D provide exemplary timing diagrams of an overcommit protocol, according to one or more embodiments.
Figure 5B:
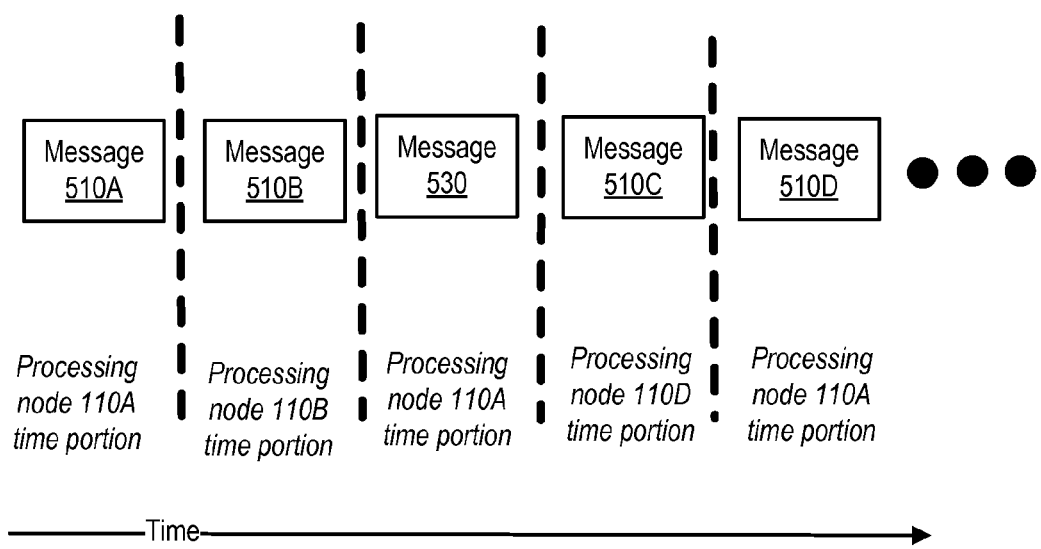

Turning now to FIGS. 5A and 5B exemplary timing diagrams of an overcommit protocol are illustrated, according to one or more embodiments. As shown, processing nodes 110A-110D can, by default, be allocated and/or utilize equal bandwidth on an interconnect, represented in FIG. 5A as equal portions of time (e.g., equal time slices). Such an arrangement is commonly referred to as time division multiplexing (TDM). As illustrated, messages 510A, 510B, 510C, 510D (which can be or include, for example, a command, a coherence response and/or data) can be provided during time portions of respective processing nodes 110A, 110B, 110D, and 110A. In one or more embodiments, a processor unit may not provide a message during its allocated time portion. As illustrated in FIG. 5A, the presence of null data 520 indicates that processing node 110C did not provide data during its allocated time portion. In one or more embodiments, null data 530 can be or include meaningless data, void data, and/or garbage data that can otherwise be ignored.

In one or more embodiments, a meaningful message can instead be provided during a time portion where null data 520 would otherwise be communicated. An overcommit protocol can be employed to allocate what would otherwise be unused interconnect bandwidth for use by a higher bandwidth master. For example, as shown in FIG. 5B, the overcommit protocol can be utilized to allocate a time portion of processing node 110C to processing node 110A, allowing processing node 110A to communicate message 530.

Figure 5C:
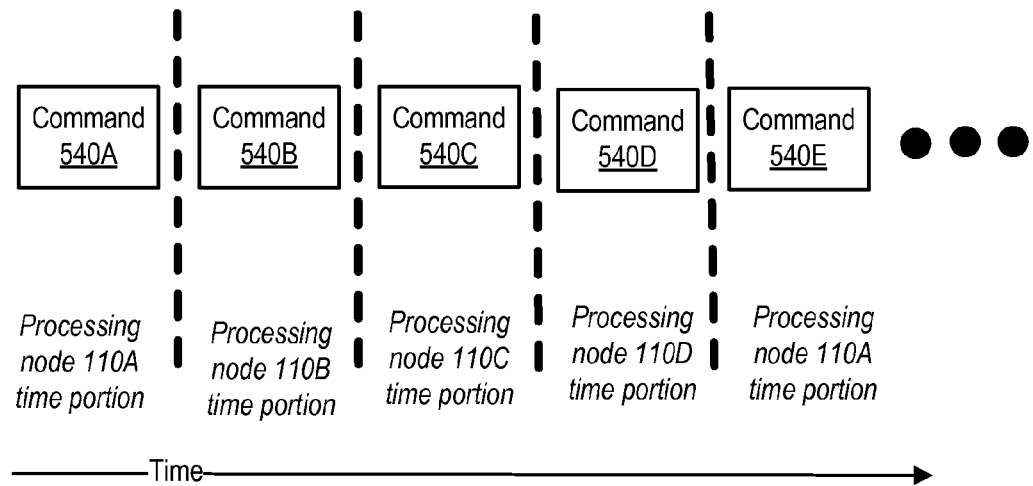
Figure 5D:
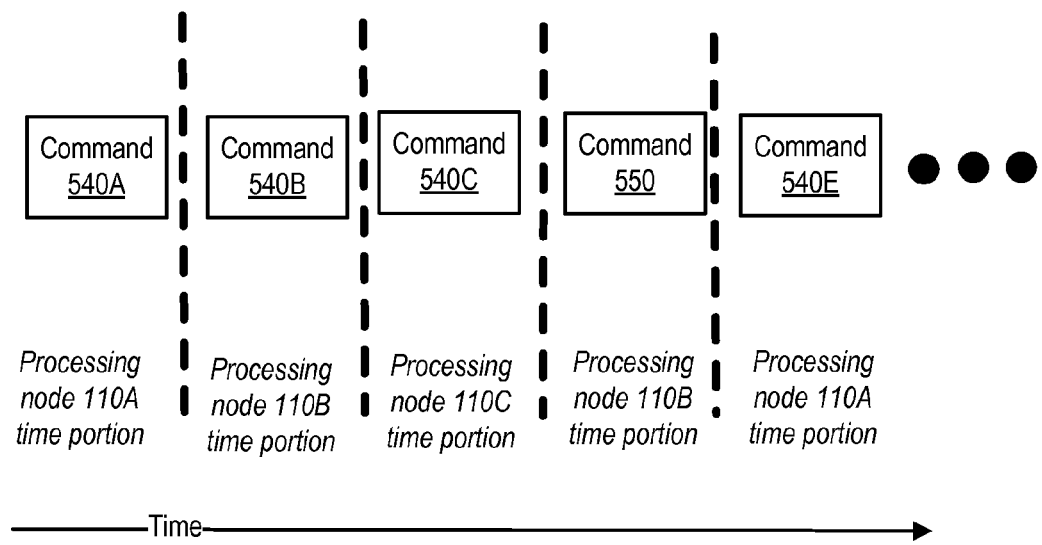

Turning now to FIGS. 5C and 5D additional exemplary timing diagrams of an overcommit protocol are illustrated, according to one or more embodiments. As shown, processing nodes 110A-110D can, by default, be allocated and/or utilize equal bandwidth on an interconnect to transmit respective commands, represented in FIG. 5C as equal portions of time (e.g., equal time slices) and/or as TDM. As illustrated, commands 540A, 540B, 540C, 540D, and 540E can be provided during time portions of respective processing nodes 110A, 110B, 110C, 110D, and 110A. In one or more embodiments, a processor unit can provide a message a low priority command during its allocated time portion. For example, processing node 110D can provide a low priority command during its allocated time portion.

In one or more embodiments, a higher priority command, instead of a lower priority command, can be provided during a time portion where low priority command MOD would otherwise be communicated. An overcommit protocol can be employed to allocate what would otherwise be utilized for low priority commands for use by higher priority commands. For example, as shown in FIG. 5D, the overcommit protocol can be utilized to allocate a time portion of processing node 110D to processing node 110B, allowing processing node 110B to communicate command 550. For instance, command 550 is a higher priority than command MOD.

Figure 6:
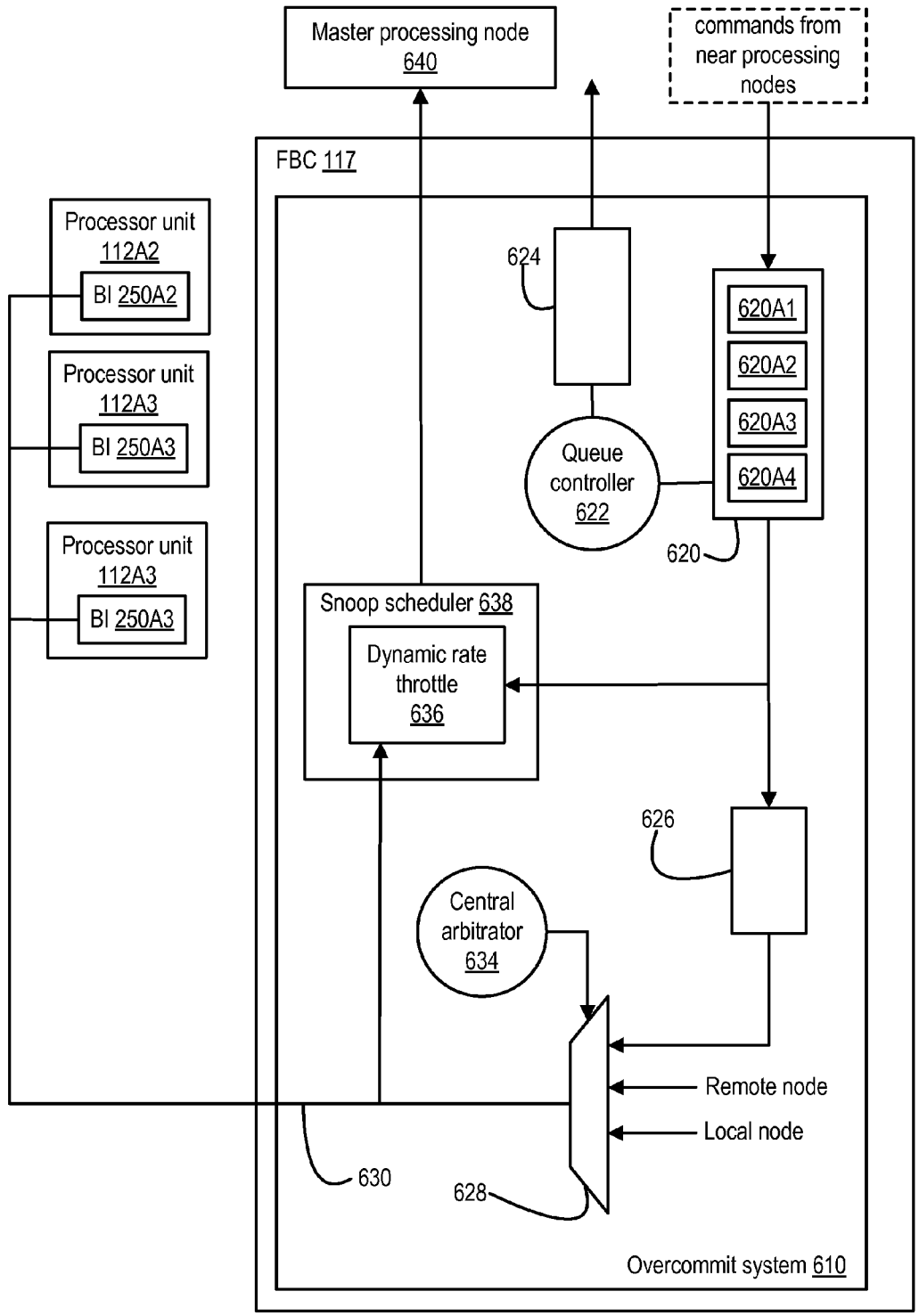
FIG. 6 provides an exemplary block diagram of an overcommit system, according to one or more embodiments.

Turning now to FIG. 6, an exemplary block diagram of an overcommit system 610 is illustrated, according to one or more embodiments. In one or more embodiments, overcommit system 610 can be or include an overcommit system of fabric control logic of an interconnect (e.g., FBC 117A of interconnect 116A), and commands from processing nodes can be or include commands from one or more of processing nodes 110A-110D and processing nodes 310A1-310D4, among others.

As illustrated, overcommit system 610 includes a link deskew buffer 620 and an overcommit queue 624 that are managed by a queue controller 622. As indicated, link deskew buffer 620 can receive commands from near processing nodes. In one example, processing nodes 310A2-310A4 can be near processing nodes of processing node 310A1, as illustrated in FIG. 3A. In another example, processing nodes 310D2-310D4 can be near processing nodes of processing node 310D1.

In one or more embodiments, link deskew buffer 620 can include a priority queue including entries 620A1-620A4, each of which can be associated with either a high priority or a low priority. In one instance, if processing node 310A1 receives a command from processing node 310A3 that is associated with a low priority and the priority queue is full (i.e., none of entries 620A1-620A4 is available for allocation and/or storage), the command from processing node 310A3 that is associated with the low priority can be dropped, and queue controller 622 can return a retry partial response (e.g., a "rty_dropped_rcmd") via overcommit queue 624. In another instance, if link deskew buffer 620 receives a first command from processing node 310A3 that is associated with a high priority, the priority queue is full, and the priority queue stores at least a second command associated with a low priority, queue controller 622 can drop the low priority second command from the priority queue of deskew buffer 620 to permit the first command to be stored.

In one or more embodiments, commands stored by entries 620A1-620A4 of link deskew buffer 620 can be associated with one or more expirations. For example, commands stored via entries 620A1-620A4 can expire after an amount of time transpires after the commands are placed in deskew buffer 620. For instance, a command stored in entry 620A1 can be discarded and/or overwritten after an amount of time transpires after the command is placed in entry 620A1. In one or more embodiments, overcommitting a command from a near processing node can include displacing and/or overwriting data of an entry (e.g., a command stored by one of entries 620A1-620A4) after an expiration of the data stored in the entry 620.

In one or more embodiments, overcommit queue 624 stores statuses of commands from link deskew buffer 620 and/or from near processing nodes. For example, overcommit queue 624 can preserve an ordering of responses corresponding to commands received from near processing nodes.

As shown, link deskew buffer 620 can be further coupled to a commit queue 626. In one or more embodiments, data stored in commit queue 626 can expire after an amount of time transpires after the data is stored. If a command stored in commit queue 626 expires, the command can be changed to a no-operation (NOP) command. Changing the command into a NOP command can preserve an ordering of responses corresponding to commands from near processing nodes. For instance, the NOP command can be or include an overcommit NOP command.

As illustrated, commit queue 626 can be coupled to a multiplexer 628, and multiplexer 628 can be coupled to a snoop bus 630, which is in turn coupled to bus interfaces 632A-632H of processor units of near processing nodes. As shown, multiplexer 628 can be further coupled to a central arbitrator 634 that controls multiplexer 628. As illustrated, link deskew buffer 620 can be coupled to a dynamic rate throttle 636 that can be included in a snoop scheduler 638.

In one or more embodiments, dynamic rate throttle 636 monitors responses of commands. For example, dynamic rate throttle 636 can monitor a rate of "retry dropped" responses (e.g., response of "rty_dropped_rcmd"). Dynamic rate throttle 636 can then adjust a command rate if a rate of "retry dropped" responses is too high. As shown, snoop scheduler 638 can be coupled to a master processing node 640.

In one or more embodiments, snoop scheduler 638 provides feedback information to master processing node 640 that can be utilized to control overcommit commands. In one example, if a rate of "retry dropped" responses is too high (e.g., at or above a threshold), snoop scheduler 638 can provide information to master processing node 640 that indicates that an overcommit command rate should be lowered. In another example, if a rate of "retry dropped" responses is at or below a level, snoop scheduler 638 can provide information to master processing node 640 that indicates that an overcommit command rate can be increased. For instance, snoop scheduler 638 can provide information that indicates that a higher overcommit command issue rate can be accommodated.

Figure 7:
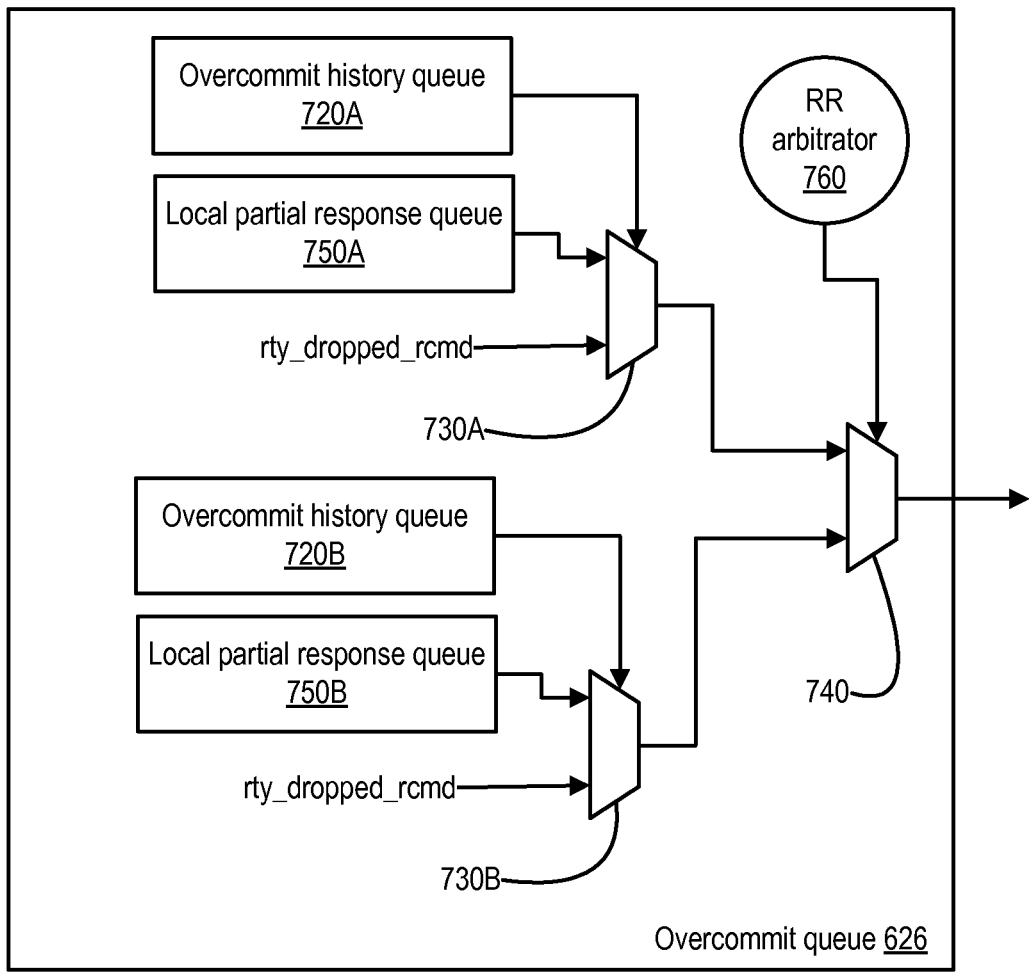
FIG. 7 provides an exemplary block diagram of an overcommit queue, according to one or more embodiments.

Turning now to FIG. 7, an exemplary block diagram of overcommit queue 626 of FIG. 6 is illustrated, according to one or more embodiments. As shown, overcommit queue 626 can include an overcommit history queue 720A and a local partial response queue 750A both coupled to a multiplexer 730A, which is in turn coupled to an output multiplexer 740. In one or more embodiments, overcommit history queue 720A can control multiplexer 730A in choosing between data from local partial response queue 750A and a "retry dropped" partial response (e.g., rty_dropped_rcmd).

As shown, overcommit queue 626 can further include an overcommit history queue 720B and a local partial response queue 750B both coupled to a multiplexer 730B, which is in turn coupled to output multiplexer 740. In one or more embodiments, overcommit history queue 720B can control multiplexer 730B in choosing between data from local partial response queue 750B and a "retry dropped" partial response (e.g., rty_dropped_cmd).

In one or more embodiments, overcommit history queue 720A, local partial response queue 750A, and multiplexer 730A can be utilized for even command addresses, and overcommit history queue 720B, local partial response queue 750B, and multiplexer 730B can be utilized for odd command addresses. A round robin (RR) arbitrator 760 can be utilized to select one of the outputs of multiplexers 730A and 730B as the output of output multiplexer 740.

Figure 8:
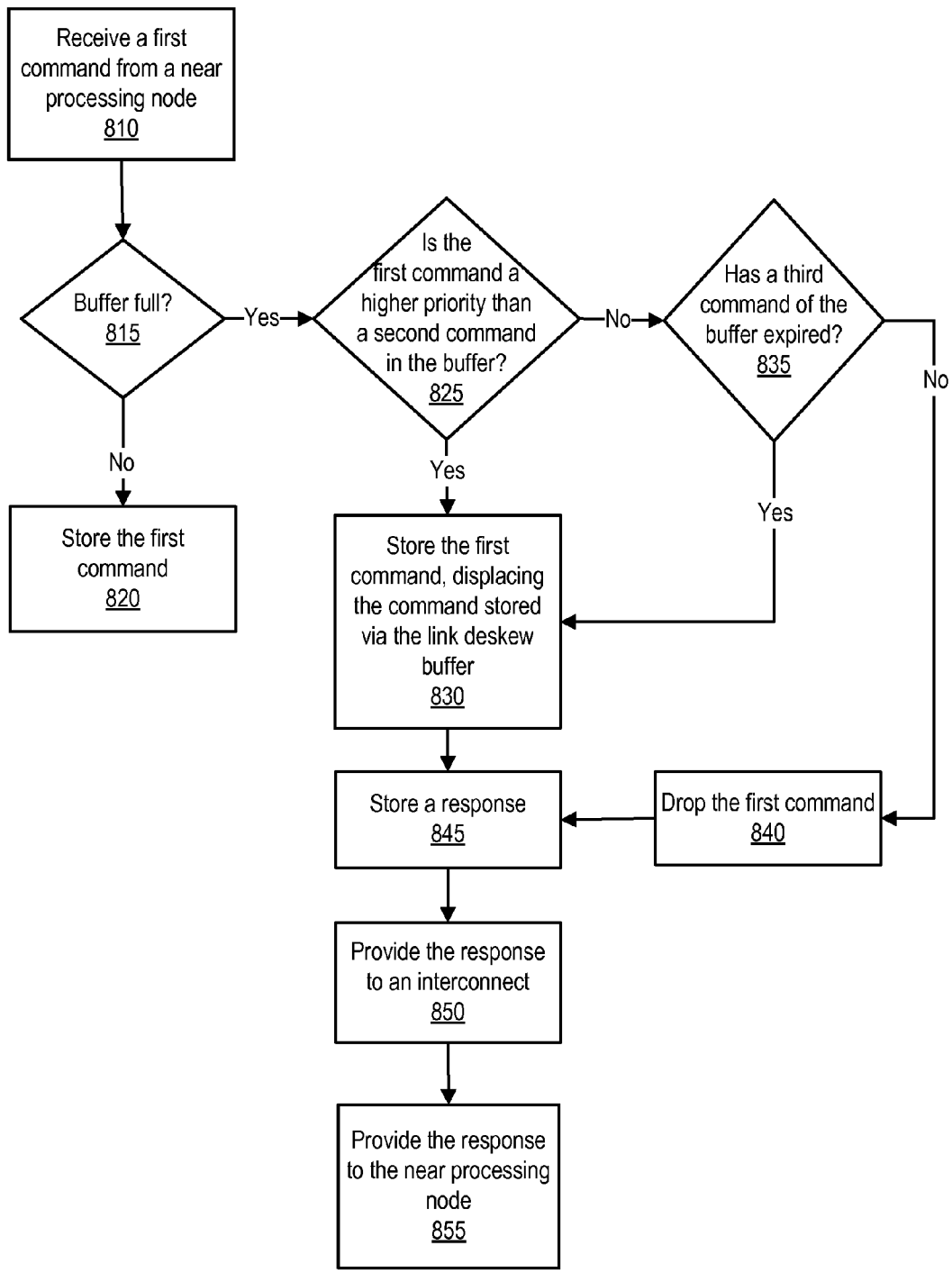
FIG. 8 provides an exemplary method of operating an overcommit system, according to one or more embodiments.

Turning now to FIG. 8, an exemplary method of operating an overcommit system, such as overcommit system 610 of FIG. 6, is illustrated, according to one or more embodiments. The method of FIG. 8 begins at block 810 when an overcommit system 610 of FIG. 6 receives a command from a near processing node. In one example, processing node 310A1 (illustrated in FIG. 3A) can include an overcommit system such as overcommit system 610, and overcommit system 610 can receive the command from processing node 310A3. In another example, processing node 310D1 (also illustrated in FIG. 3A) can include an overcommit system such as overcommit system 610, and overcommit system 610 can receive the command from processing node 310D2.

At block 815, queue controller 622 determines if link deskew buffer 620 is full (e.g., at capacity). If link deskew buffer 620 is not full, the first command can be stored in link deskew buffer 620 (block 820). If link deskew buffer 620 is full at block 815, queue controller 622 determines at block 825 whether or not the first command has a higher priority than a second command stored in link deskew buffer 620. If the first command has a higher priority than the second command, queue controller 622 causes the first command to be enqueued in link deskew buffer 620, displacing the second command (block 830). The first command is said to be "overcommitted" when it displaces the second command, according to one or more embodiments.

In response to a determination at block 825 that the first command does not have a higher priority than the second command, queue controller 622 determines at block 835 if a third command stored in link deskew buffer 620 has expired. In response to a determination at block 835 that the third command has expired, queue controller 622 causes the first command to be enqueued in link deskew buffer 620, displacing the third command (block 830). The first command is said to be "overcommitted" when it displaces the third command, according to one or more embodiments. In response to a determination at block 835 that the third command has not expired, the first command is dropped at block 840. In one or more embodiments, the third command can be the second command.

In one or more embodiments, if a command is displaced or dropped, a corresponding partial response is still stored. In one example, if the second command is displaced at block 830, queue controller 622 stores a partial response (e.g., "rty_dropped_rcmd") in overcommit queue 626, at block 845. In another example, if the first command is dropped at block 840, queue controller 622 stores a partial response (e.g., "rty_dropped_rcmd") in overcommit queue 626, at block 845.

At block 850, overcommit queue 626 can provide the partial response to an interconnect. In one example, overcommit queue 626 can provide the partial response, indicating that the first command or the second command was displaced or dropped, to interconnect 120. In another example, overcommit queue 626 can provide the partial response, indicating that the first command or the second command was displaced or dropped, to interconnect 117. At block 855, interconnect 120 can provide the partial response to the near node that provided the command that was displaced or dropped.

In one or more embodiments, an interconnect can assign different command issue rates depending on a drop priority. In one example, a low drop priority can be associated with a higher issue rate. For instance, low drop priority commands can be speculative. In another example, a high drop priority can be associated with a lower issue rate. In this fashion, an interconnect can control a number of commands issued such that high drop priority commands can be most likely succeed independent of system traffic, and low priority commands can succeed as long as there is not contention with other low drop priority commands of other processing nodes.

In one or more embodiments, fabric command arbiters can assign a command issue rate based on one or more of a command scope, a drop priority, and a command rate level, among other criteria. For example, a fabric command arbiter can include a hardware control mechanism using coherency retries as feedback. For instance, a fabric command arbiter (e.g., central arbitrator 634 shown in FIG. 6) can be configured with eight issue rate levels from zero (highest) to seven (lowest). Exemplary Table II, below, provides exemplary reflected command rate settings.

In one or more embodiments, an interconnect coherency transport can include two snoop buses. For example, a first snoop bus can be utilized for even addresses, and a second snoop bus can be utilized for odd addresses. In one or more embodiments, commands can be issued from multiple sources that can be local (within the local processing node), near (other processing nodes within a local group), or remote (processing nodes from a remote group. An interconnect (e.g., a network topology where nodes can be coupled to one another via network switches, crossbar switches, etc.) can determine a physical broadcast, where processing nodes snoop a command according to a coherency scope provided by a processor unit.

As the physical broadcasts increase per time period (e.g., broadcast rate), there can be an increasing likelihood that commands will compete for a finite snoop bandwidth of a processing node. If all processing nodes issue commands at a largest broadcast scope then there can be insufficient snoop bandwidth in a data processing system. In one example, sourcing processing nodes can limit their broadcast rate. In another example, a data processing system can handle the overutilization of snoop buses.

Figure 9:
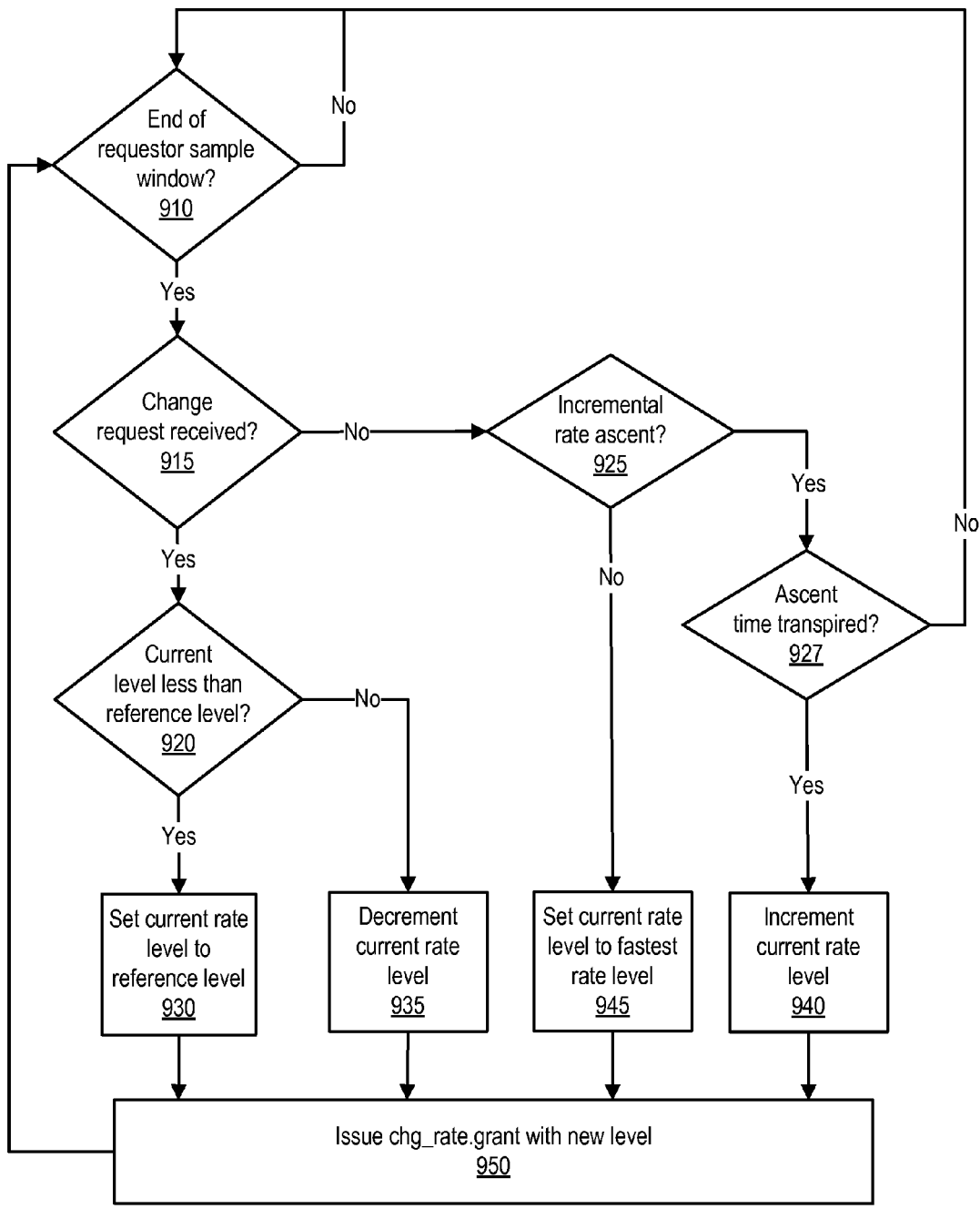
FIG. 9 provides an exemplary method of operating a dynamic rate throttle, according to one or more embodiments.

Turning now to FIG. 9, a method of operating a dynamic rate throttle 636 of FIG. 6 is illustrated, according to one or more embodiments. The method of FIG. 9 begins at block 910, which illustrates dynamic rate throttle 636 of FIG. 6 determining if an end of a sample window has been reached.

TABLE II

| Command Rate | Rate Level | Group Scope (clock cycles) | | | Remote Group Scope (clock cycles) | | | System Scope (clock cycles) | | |
|---|---|---|---|---|---|---|---|---|---|---|
| | | low | med | high | low | med | high | low | med | high |
| Fastest Pacing Rate | 0 | 3 | 3 | 4 | 9 | 10 | 12 | 12 | 16 | 20 |
| | 1 | 4 | 4 | 5 | 10 | 11 | 13 | 13 | 17 | 22 |
| | 2 | 5 | 5 | 6 | 11 | 12 | 14 | 14 | 18 | 24 |
| | 3 | 6 | 6 | 7 | 12 | 13 | 15 | 15 | 20 | 26 |
| | 4 | 7 | 7 | 8 | 13 | 14 | 16 | 16 | 24 | 32 |
| | 5 | 8 | 9 | 10 | 14 | 14 | 16 | 20 | 30 | 40 |
| | 6 | 10 | 11 | 12 | 16 | 24 | 32 | 32 | 48 | 64 |
| Slowest Pacing Rate | 7 | 16 | 16 | 16 | 32 | 32 | 32 | 64 | 64 | 64 |

In one or more embodiments, processing nodes included in a data processing system can run at the same rate level for system scope commands and remote group scope commands, and processing nodes included in a group can run at the same rate level for group scope commands. One processing node of the data processing system can be designated as a system rate master (SRM). For example, the SRM can determine the System Scope rates and the Remote Group rates by snooping change rate request commands for the System Scope/Remote Group rate level and can respond by issuing change rate grant commands to set a new System Scope/Remote Group rate level. One processing node in the group can be designated as a group rate master (GRM). For example, the GRM can determine the Group Scope rates by snooping change rate request commands for the Group Scope rate level from the local group and can respond by issuing change rate grant commands to set new Group Scope rate levels.

In one or more embodiments, snoop scheduler 638 (illustrated in FIG. 6) can receive commands from link deskew buffer 620 and can serve as a feedback mechanism that controls overcommit rates. For example, dynamic rate throttle 636 can receive change rate grant commands and can issue change rate grant commands to set new rate levels.

In one or more embodiments, dynamic rate throttle 636 functions as a change rate master. For example, dynamic rate throttle 636 can function as a change rate master of a processing node (e.g., processing node 310A illustrated in FIG. 3A). If dynamic rate throttle 636 determines that the end of the sample window has not been reached, the method remains at block 910. In response to dynamic rate throttle 636 determining that the end of the sample window has been reached, dynamic rate throttle 636 determines at block 915 if a change rate request has been received. In one or more embodiments, the change rate request can be based on at least one of an issue rate of speculative commands and a number of overcommit failures, among others.

If dynamic rate throttle 636 determines at block 915 that the change rate request has been received, dynamic rate throttle 636 determines if a current rate level is less than a reference command rate level (block 920). In one or more embodiments, a data processing system can be configured with a command rate level (e.g., a reference command rate level) that can be utilized as a reference for a comparison with another command rate level and/or a minimum command rate level. If dynamic rate throttle 636 determines that the current rate level is less than the reference command rate level, dynamic rate throttle 636 sets the current rate level to the reference command rate level (block 930). If, however, dynamic rate throttle 636 determines the current rate setting is not less than the reference command rate level at block 920, dynamic rate throttle 636 decrements the current rate by one rate level (block 935).

With reference again to block 915, if dynamic rate throttle 636 determines that a change rate request has not been received, dynamic rate throttle 636 can further determine if an incremental command rate ascent is applicable (block 925). For example, dynamic rate throttle 636 can determine if an incremental command rate ascent is applicable based on a system configuration. In one or more embodiments, an incremental command rate ascent can be included in a policy of operation. For example, the policy of operation can include incrementing the current rate level by at least one faster rate level rather than increasing the current rate level to a fastest command rate level (e.g., the "Fastest Pacing Rate" as shown in Table II).

If dynamic rate throttle 636 determines at block 925 that an incremental command rate ascent is applicable, dynamic rate throttle 636 can determine if an ascent time has transpired (block 927). In one or more embodiments, an ascent time can be utilized to temper and/or moderate incrementing a command rate ascent. For example, dynamic rate throttle 636 can increment the command rate (to a faster rate level) after the ascent time transpires. For instance, if dynamic rate throttle 636 determines that the current command rate level is to be incremented before the ascent time transpires, dynamic rate throttle 636 will not increment the current command rate level. If the ascent time has transpired, dynamic rate throttle 636 increments the current rate by one faster rate level (block 940). If, however, the ascent time has not transpired, the method can return to block 910, which has been described.

With reference again to block 925, if dynamic rate throttle 636 determines that an incremental command rate decent is not applicable, dynamic rate throttle 636 sets the current rate level to a fastest command rate level (block 945). As illustrated, each of blocks 930-945 can proceed to block 950, which illustrates dynamic rate throttle 636 issuing a change rate grant command with the level as set at one of blocks 930-945. For example, dynamic rate throttle 636 can issue the change rate grant command with the level, that was set by one of blocks 930-945 to master processing node 640 (illustrated in FIG. 6) via snoop scheduler 638. In one or more embodiments, the change rate grant command can be associated with one of a group scope, a remote group scope, and a system scope, among others. Following block 950, the method can return to block 910, which has been described.

Figure 10:
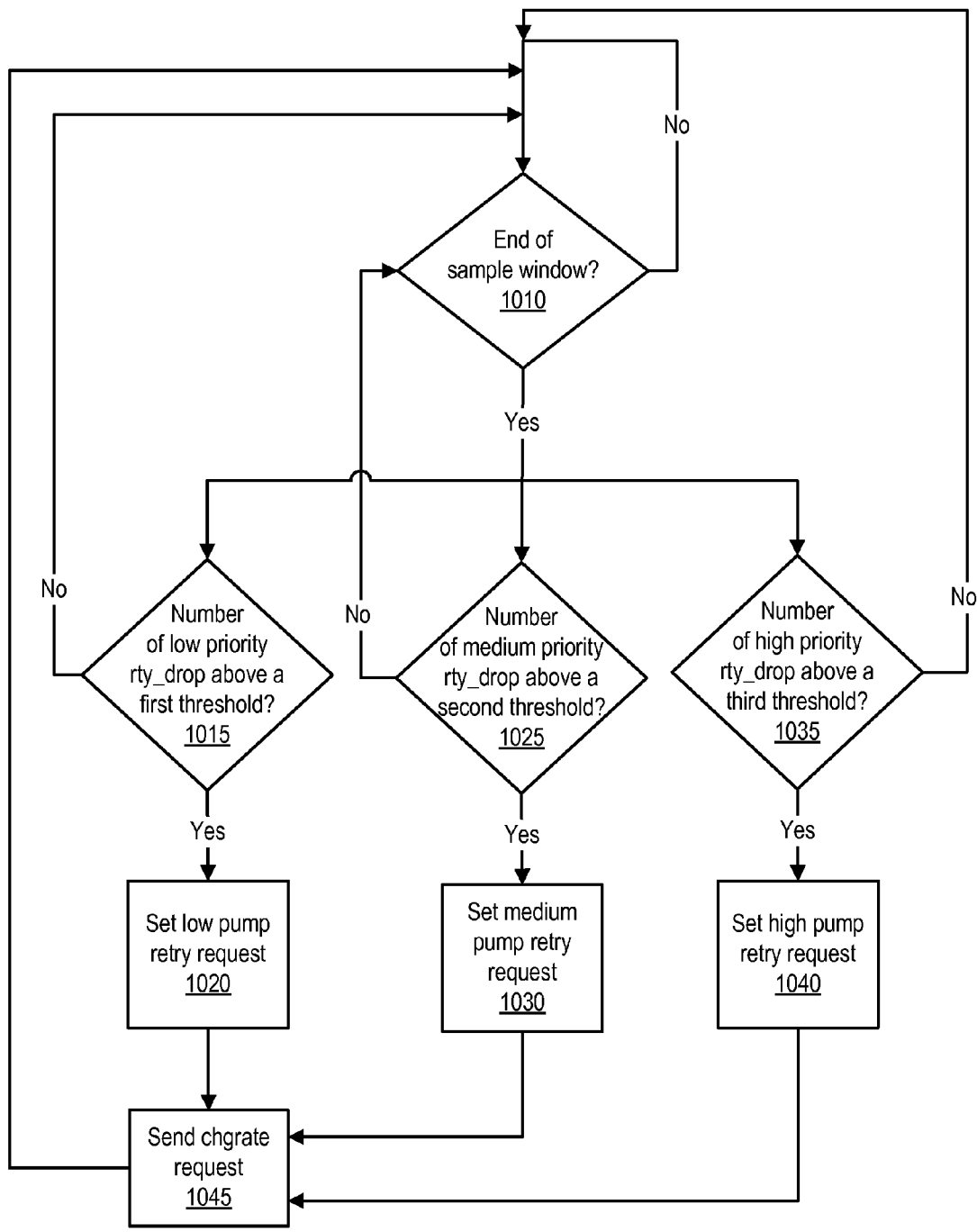
FIG. 10 provides another exemplary method of operating a dynamic rate throttle, according to one or more embodiments.

Turning now to FIG. 10, another method of operating a dynamic rate throttle 636 is illustrated, according to one or more embodiments. At block 1010, dynamic rate throttle 636 of FIG. 6 can determine if an end of a sample window has been reached. In one or more embodiments, a dynamic rate throttle can function as a change rate requestor. For example, dynamic rate throttle 636 can function as a change rate requestor of a processing node (e.g., processing node 110A illustrated in FIG. 1). The process of FIG. 10 remains at block 1010 until the end of a sample window is reached, according to one or more embodiments.

In response to dynamic rate throttle 636 determining that the end of the sample window has been reached, dynamic rate throttle 636 can make one or more of the determinations illustrated at block 1015, 1025 and 1035. In particular, at block 1015 dynamic rate throttle 636 determines if a number of low priority retry drops (rty_drop) is above a first threshold. If dynamic rate throttle 636 determines at block 1015 that the number of low priority retry drops is not above the first threshold, the method can return to block 1010. If, however, dynamic rate throttle 636 determines that the number of low priority retry drops is above the first threshold, dynamic rate throttle 636 can set a low priority retry request, at block 1020.

At block 1025, dynamic rate throttle 636 determines if a number of medium priority retry drops (rty_drop) is above a second threshold. If dynamic rate throttle 636 determines at block 1025 that the number of medium priority retry drops is not above the second threshold, the method can return to block 1010. If, on the other hand, dynamic rate throttle 636 determines that the number of medium priority retry drops is above the second threshold, dynamic rate throttle 636 can set a medium priority retry request at block 1030.

At block 1035, dynamic rate throttle 636 determines if a number of high priority retry drops (rty_drop) is above a third threshold. If dynamic rate throttle 636 determines at block 1035 that the number of high priority retry drops is not above the third threshold, the method can return to block 1010. If, however, dynamic rate throttle 636 determines at block 1035 that the number of high priority retry drops is above the third threshold, dynamic rate throttle 636 can set a high priority retry request at block 1040.

In one or more embodiments, blocks 1015, 1025, and 1035 can be performed in a parallel fashion. For example, blocks 1015, 1025, and 1035 can be performed concurrently and/or simultaneously. In one or more other embodiments, blocks 1015, 1025, and 1035 can be performed serially. For example, a first one of blocks 1015, 1025, and 1035 can be performed before a second and a third of blocks 1015, 1025, and 1035 are performed.

As illustrated, the method proceeds from any or each of blocks 1020, 1030, and 1040 to block 1045, which depicts dynamic rate throttle 636 sending a change rate request determined at one of blocks 1020, 1030, and 1040. For example, dynamic rate throttle 636 can send the change rate request set by one of blocks 1020, 1030, and 1040 to master processing node 640 (illustrated in FIG. 6) via snoop scheduler 638. Following block 1045, the method of FIG. 10 can return to block 1010.

In one or more embodiments, the method illustrated in FIG. 10 can be utilized with one or more of a Group Scope, a Remote Group Scope, and a System Scope. For example, low, medium, and high priorities of Table II can be utilized with one or more of the Group Scope, the Remote Group Scope, and the System Scope set forth in Table II. For instance, the method illustrated in FIG. 10 can be utilized for each of the Group Scope, the Remote Group Scope, and the System Scope provided via Table II.

In one or more embodiments, coherency bandwidth in a heavy utilized system can experience periods of congestion such that high drop priority commands may not be successfully broadcast to processing nodes of a system, and a command priority override (CPO) system can be utilized to communicate critical high drop priority commands. In one example, the CPO system can be invoked when high priority system maintenance commands are unable to make forward progress due to an excessive number of retries. For instance, the CPO system can be utilized to force and/or compel a central arbiter (e.g., central arbitrator 634 shown in FIG. 6) to back-off to a preconfigured command rate (e.g., a rate level among the rate levels enumerated in Table II). In a second example, a CPO signal can be asserted by any bus master when a number of retries exceeds a threshold. In another, a snoop scheduler (e.g., a snoop scheduler such as snoop scheduler snoop scheduler 638 shown in FIG. 6) of a bus snooper can override, by asserting a CPO signal, one or more command rate levels of respective one or more central arbiters. In other words, for instance, a bus snooper of a processor unit can assert a CPO signal to override command rate levels of other bus snoopers of other processor units.

In one or more embodiments, the CPO system can utilize and/or implement out-of-band signaling. In one example, the CPO system can utilize signaling (e.g., information conveyance) that can be different from one or more reflected commands. In another example, CPO signals can be transported via an interconnect (e.g., a fabric interconnect) and/or external links. For instance, during one or more periods of congestion, such that high drop priority commands may not successfully broadcast to processing nodes of the system, the out-of-band signaling utilized by the CPO system can provide a mechanism that provides transport and/or reception of information between or among processing nodes of the data processing system.

Figure 11:
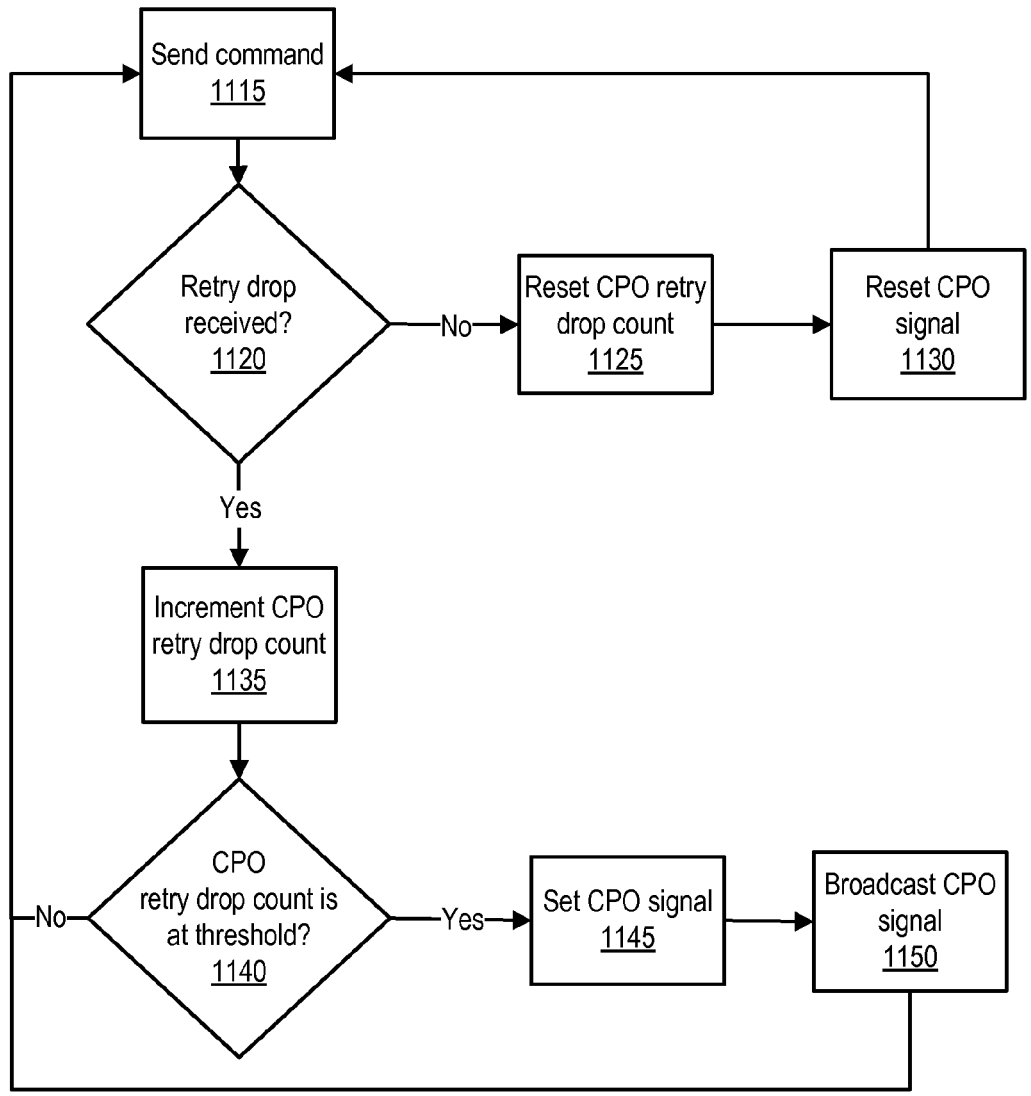
FIG. 11 provides an exemplary method of operating a command priority override master, according to one or more embodiments.

Turning now to FIG. 11, a method of operating a command priority override master is illustrated, according to one or more embodiments. The method of FIG. 11 begins at block 1115, where the rate master can send a rate master command. At block 1120, snoop scheduler 638 determines if a retry drop (e.g., "rty_drop") associated with the rate master command sent at block 1115 has been received. If snoop scheduler 638 determines at block 1120 that a retry drop associated with the rate master command has not been received, snoop scheduler 638 can reset a CPO retry drop count (block 1125) and reset a CPO signal (block 1130). Thereafter, the method can return to block 1115, which has been described.

With reference to block 1120, if snoop scheduler 638 determines that a retry drop associated with the rate master command has been received, snoop scheduler 638 can increment the CPO retry drop count at block 1135. At block 1140, snoop scheduler 638 determines if the retry drop count is at a threshold. If not, the method of FIG. 11 returns to block 1115, which has been described. If, however, snoop scheduler 638 determines that the retry drop count is at a threshold, snoop scheduler 638 sets the CPO signal at block 1145. In one or more embodiments, setting the CPO signal can include setting change rate levels that can be included in the CPO signal. For example, snoop scheduler 638 can set a rate level (e.g., described in Table II) that can be included in the CPO signal. For instance, snoop scheduler 638 can set a rate level of seven (e.g., a slowest pacing rate).

At block 1150, snoop scheduler 638 broadcasts the CPO signal. In one example, snoop scheduler 638 can broadcast the CPO signal to its group, when snoop scheduler 638 is functioning as a group rate master. For instance, snoop scheduler 638 can broadcast the CPO signal to one or more of processor units 112A2-112A4 via interconnect 116A (shown in FIG. 1). In another example, snoop scheduler 638 can broadcast the CPO signal to a system (e.g., an MP system, a system of processing nodes, etc.) when snoop scheduler 638 is functioning as a system rate master. In one instance, snoop scheduler 638 can broadcast the CPO signal to one or more of processing nodes 110B-110D via interconnect 120 (shown in FIG. 1). In another instance, snoop scheduler 638 can broadcast the CPO signal to one or more of MP systems 110B-110C via interconnect 330 (shown in FIG. 3E). Following block 1150, the method of FIG. 11 can return to block 1115.

Figure 12:
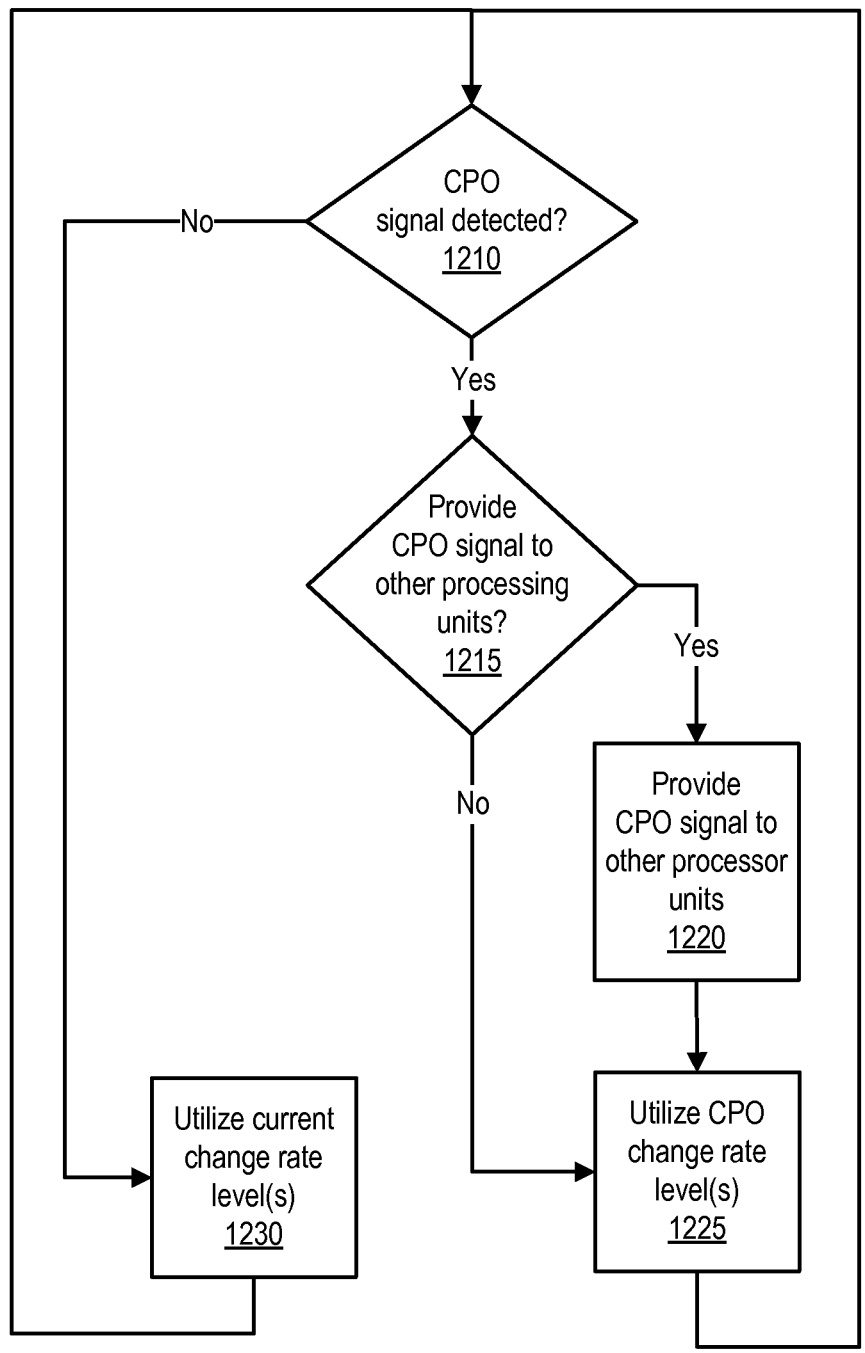
FIG. 12 provides an exemplary method of operating a command priority override client is illustrated, according to one or more embodiments.

Turning now to FIG. 12, a method of operating a command priority override client is illustrated, according to one or more embodiments. The method of FIG. 12 begins at block 1210, which depicts snoop scheduler 638 determining if a CPO signal is detected. In one or more embodiments, snoop scheduler 638 can be a different snoop scheduler than the snoop scheduler of FIG. 11. For example, snoop scheduler 638 as utilized in FIG. 12 can be or include a snoop scheduler of a processor unit and/or of a processing node. In one instance, snoop scheduler 638 can detect a CPO signal via interconnect 116A (shown in FIG. 1) and/or via "local node" input of multiplexer 628 (as shown in FIG. 6). In a second instance, snoop scheduler 638 can detect a CPO signal via interconnect 120 (shown in FIG. 1) and/or via "remote node" input of multiplexer 628 (as shown in FIG. 6). In another instance, snoop scheduler 638 can detect a CPO signal via interconnect 330 (shown in FIG. 3E).

If snoop scheduler 638 determines at block 1210 that the CPO signal is detected, snoop scheduler 638 can determine if the CPO signal is to be provided to other processor units at block 1215. If snoop scheduler 638 determines at block 1215 that the CPO signal is to be provided to other processor units, snoop scheduler 638 can provide the CPO signal to other processor units (block 1220). For example, snoop scheduler 638 can provide the CPO signal to one or more other processor units, such as one or more processor units 112A2-112A4 (as shown in FIG. 1). If, on the other hand, snoop scheduler 638 determines at block 1215 that the CPO signal is not to be provided to other processor units, snoop scheduler 638 can utilize one or more CPO change rate levels conveyed via the CPO signal, at block 1225.

Referring again to block 1210, if snoop scheduler 638 determines that the CPO signal is not detected, snoop scheduler 638 can utilize a current one or more change rate levels, as shown at block 1230. In one or more embodiments, utilizing a current one or more change rate levels can include not changing the current one or more change rate levels. As shown, the method of FIG. 12 can return to block 1210 from either block 1225 or block 1230.

In one or more embodiments, performance and energy efficiency can be maximized based upon a dynamic system workload. For example, one or more processor units and one or more respective caches can operate utilizing multiple clock frequencies. Operating at a lower clock frequency can be more energy efficient than operating at a higher clock frequency. In one or more embodiments, a command rate can be lowered to accommodate a lowered clock frequency of one or more of a processor unit, a cache, and a coherency bus. For example, reducing the command rate can prevent overrunning one or more of a processor unit, a cache, and a coherency bus running at a lowered clock frequency.

In one or more embodiments, a central command arbiter and a response arbiter can track numbers of commands and responses, respectively, that are in-flight to each processor unit by maintaining a counter for each processor unit. For example, when a command or a response is broadcast, each enabled processor unit's counter is incremented. In one or more embodiments, if the counter reaches a programmable threshold value, no more commands or responses may be broadcast.

In one or more embodiments, a command or a response can cross an asynchronous interface of a processor unit and can be broadcast to other processor units. When this occurs, the processor unit can provide a return credit back to a central arbiter, and the central arbiter can decrement a counter that can allow more commands or responses to be broadcast.

In one or more embodiments, a processor unit can support a maximum number of commands. For example, a central arbitrator threshold can be the maximum number of commands that the processor unit can support. For instance, the maximum number of commands can be sixteen, and accordingly, a threshold of a central arbitrator can be sixteen.

In one or more embodiments, the maximum number of commands that the processor unit can support and the threshold of the central arbitrator can be programmable and/or settable. For example, as processor unit frequencies decrease, a default threshold can be lowered. For instance, the default threshold can be lowered to twelve, eight, four, etc. outstanding commands.

Figure 13:
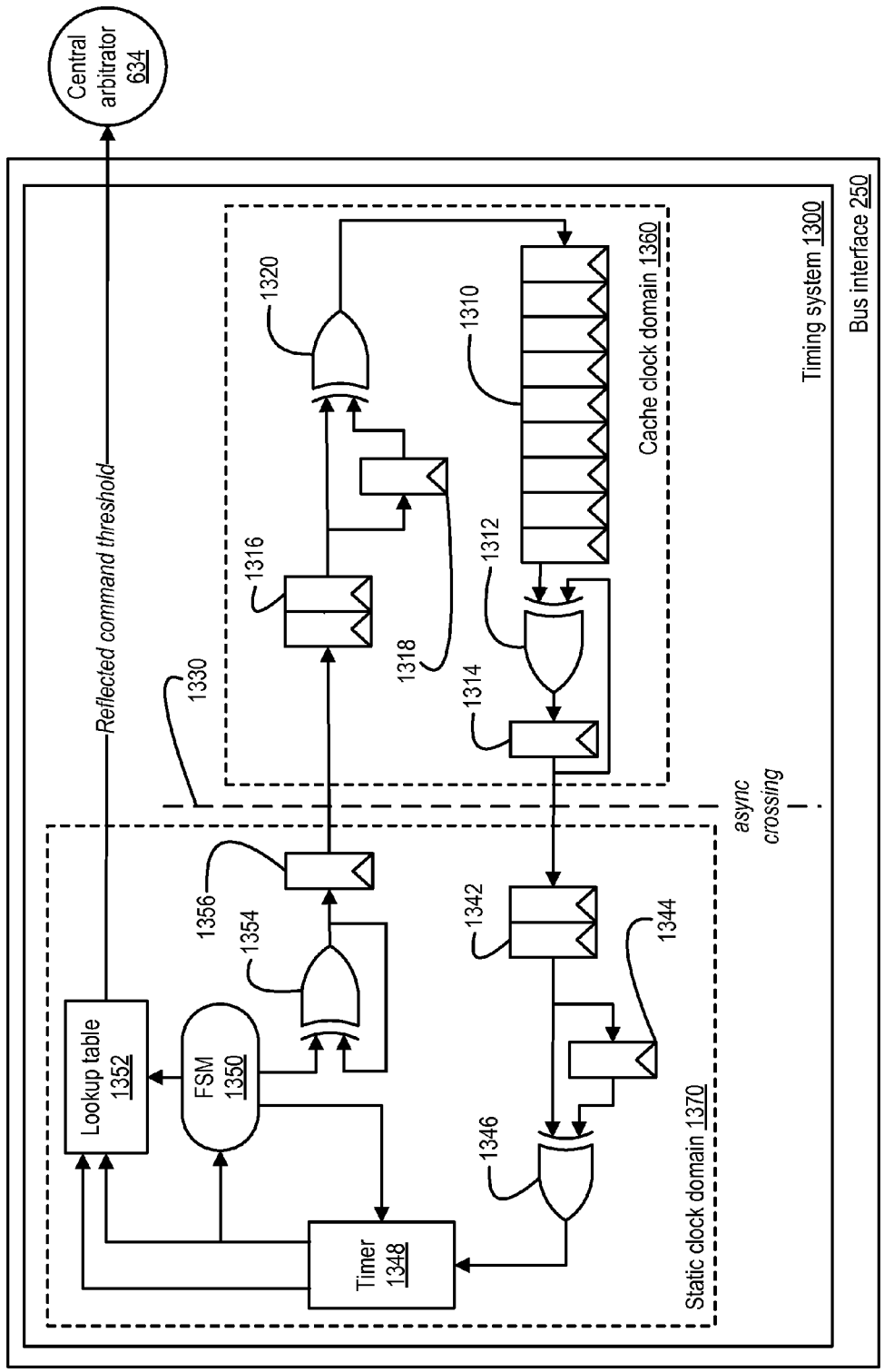
FIG. 13 provides an exemplary timing system that can determine a maximum number of commands that a processor unit can support while maximizing performance and energy efficiency based upon a dynamic system workload, according to one or more embodiments.

Turning now to FIG. 13, a timing system 1300, that can determine a maximum number of commands that a processor unit can support (e.g., a reflected command threshold) while maximizing performance and energy efficiency based upon a dynamic system workload, is illustrated, according to one or more embodiments. For illustrative purposes, an asynchronous (async) crossing 1330 is depicted in FIG. 13 to logically (e.g., not necessarily physically) partition portions of timing system 1300. As illustrated, a cache clock domain 1360 depicted to the right of async crossing 1330 can include elements 1310-1320, such as latches 1310, 1314, 1316 and 1318 and exclusive OR (XOR) gates 1312 and 1320. The static clock domain 1370 depicted to the left of async crossing 1330 can include elements 1342-1356, such as latches 1342, 1344 and 1356, XOR gates 1346 and 1354, and a finite state machine (FSM) 1350 coupled to a timer 1348 and a lookup table 1352.

In one or more embodiments, static clock domain 1370 is associated with a static clock frequency, while cache clock domain 1360 can be associated with a variable clock frequency, based a dynamic system workload. For example, cache clock domain 1360 can be associated with one half of a processor unit frequency (e.g., a core frequency), and a core frequency (e.g., a frequency of a processor unit) can vary from one half the static clock frequency to two times (plus or minus ten percent) the static clock frequency. In this example, latches 1342, 1344 and 1356 of static clock domain 1370 can be controlled via a static clock frequency, and latches 1310, 1314, 1316 and 1318 of cache clock domain 1360 can be controlled via a cache clock frequency (e.g., one half of a core frequency).

In one or more embodiments, timing system 1300 can determine a number of clock cycles that elapse (e.g., are consumed) as a signal traverses async crossing 1330 twice (e.g., a roundtrip time). For example, in one or more embodiments, FSM 1350 starts from an initial idle state and, in response to receipt of an input signal from timer 1348, transitions to an "update output" state in which FSM 1350 provides outputs to lookup table 1352 and to XOR gate 1354.

In response to receipt of the signal from FSM 1350, XOR gate 1354 transmits the signal via latch 1356 to cache clock domain 1360, through which the signal circulates (and is optionally modified by logical elements such as XOR gates 1312 and 1320). The signal as latched and modified in cache clock domain 1360 is then returned to static clock domain 1370 at latches 1342. Following further modification by XOR gate 1346 and latch 1344, the circulating signal is received by timer 1348.

In one or more embodiments, timer 1348 can be or include a counter and/or clock divider that can count and/or divide the signal received from XOR 1346. In one example, timer 1348 can provide a count (e.g., a bit pattern of a count) to lookup table 1352. In another example, timer 1348 can provide a "done" signal to lookup table 1352 and FSM 1350. For instance, the "done" signal can be based on an overflow of a clock divider and/or a counter. In this manner, timing system 1300 can determine a number of clock cycles that elapses while a signal from static clock domain 1370 is in cache clock domain 1360.

In one or more embodiments, lookup table 1352 can provide a reflected command threshold based on the inputs provided by timer 1348 and FSM 1350. For example, lookup table 1352 can provide a reflected command threshold to a fabric command arbiter (e.g., central arbitrator 634 shown in FIG. 6) such as sixteen, twelve, eight, and four, as provided in Table III.

TABLE III

| Domain | Number of Latches | Number of Nest Cycles Per Cache Cycle | | | |
|---|---|---|---|---|---|
| | | 1 | 1.5 | 3 | 4 |
| Static | 3 | 3 | 3 | 3 | 3 |
| Cache | 10 | 10 | 15 | 20 | 40 |
| Total Number of Nest Cycles | 13 | 13 | 18 | 23 | 43 |
| Setting Sent to Reflected Command Arbitrator | | 000 | 001 | 010 | 100 |
| Reflected Command Threshold | | 16 | 12 | 8 | 4 |

Figure 14:
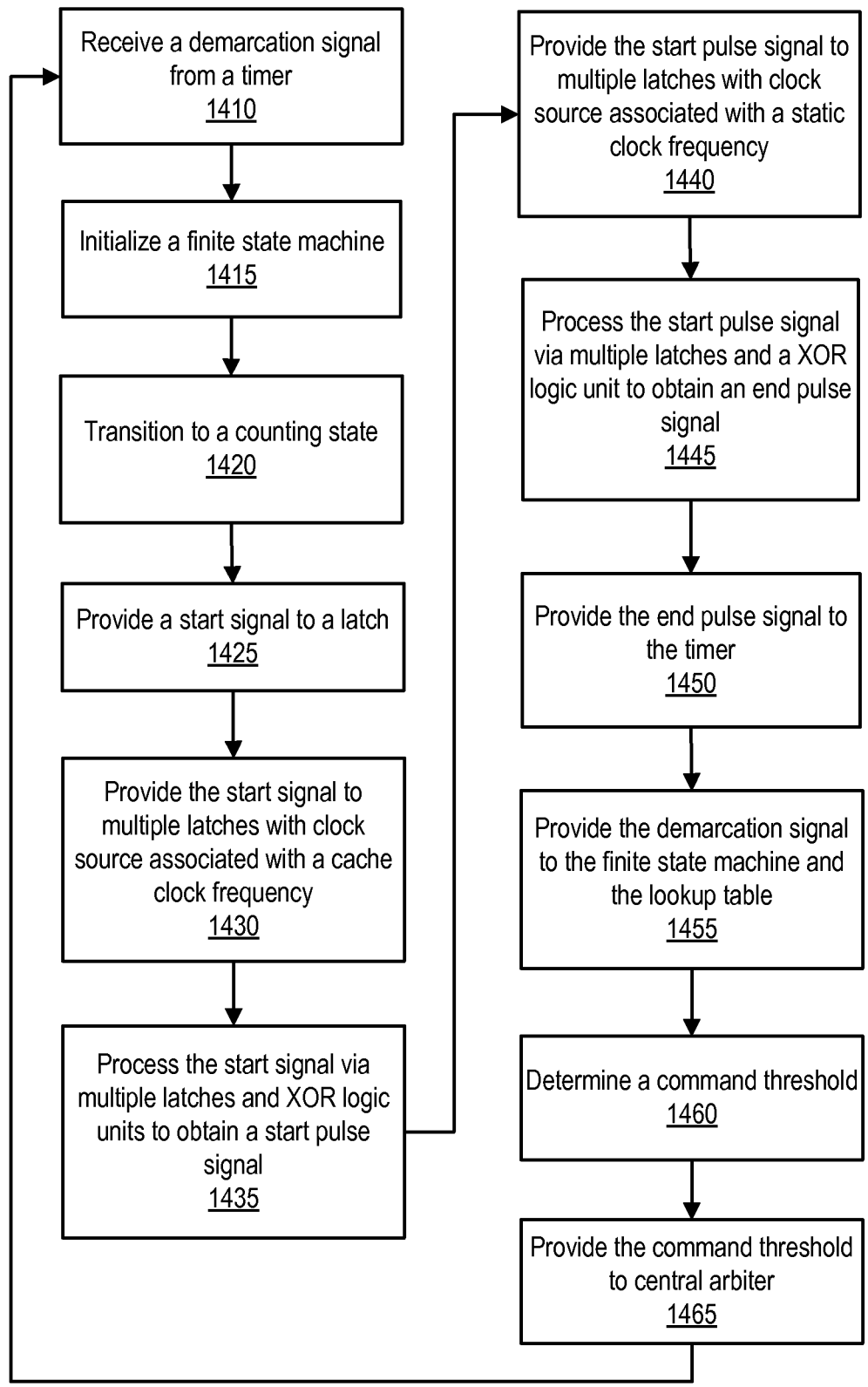
FIG. 14 provides an exemplary method of determining a command threshold in a timing system, according to one or more embodiments.

Turning now to FIG. 14, there is depicted an exemplary method of determining a reflected command threshold in a timing system such as that illustrated in FIG. 13 according to one or more embodiments. As shown at blocks 1410 and 1415, FSM 1350 initializes itself in response to receipt of a demarcation signal from timer 1348. In one or more embodiments, the demarcation signal associated with block 1410 can indicate that FSM 1350 can transition to an initial state. For example, timer 1348 can provide the demarcation signal to FSM 1350 when timer 1348 is started and/or when timer 1348 overflows (e.g., reaches its counter limit). Following initialization, FSM 1350 transitions to a counting state (block 1420).

At block 1425, XOR logic unit 1354 provides a start signal to output latch 1356. For example, the start signal can be or include a test signal pattern. In one or more embodiments, the start signal can be based on a signal from FSM 1350 and a feedback signal of XOR gate 1354. At block 1430, output latch 1356 provides the start signal to input latches 1316 of cache clock domain 1360. In one or more embodiments, when output latch 1356 provides the start signal to input latches 1316, the start signal traverses async crossing 1330 from a first clock domain to a second clock domain. For example, the first clock domain operates at a first frequency, and the second clock domain operates at a second frequency, which can be the same as or different than the first frequency. In one or more embodiments, the first frequency can be a static frequency, and the second frequency can be a cache clock frequency.

At block 1435, the start signal is processed in cache clock domain 1360 via multiple latches and XOR gates to obtain a start pulse signal. For example, as illustrated in FIG. 13, the start signal can be processed via input latches 1316, latch 1318, XOR gate 1320, latches 1310, XOR gate 1312, and output latch 1314. At block 1440, output latch 1314 provides the start pulse signal to input latches 1342 of static clock domain 1370. In one or more embodiments, when latch 1314 provides the start pulse signal to input latches 1342, the start pulse signal traverses async crossing 1330 from the second clock domain to the first clock domain.

At block 1445, input latches 1342, latch 1344, and XOR gate 1346 process the start pulse signal to obtain an end pulse signal. At block 1450, XOR gate 1346 provide the end pulse signal to timer 1348. At block 1455, timer 1348 provides the demarcation signal to FSM 1350 and lookup table 1352. At block 1460, lookup table 1352 determines a maximum number of commands that the processor unit can support (e.g., a reflected command threshold) while maximizing performance and energy efficiency based upon a dynamic system workload. At block 1465, lookup table 1352 provides the determined maximum number of commands to central arbiter 634.

As has been described, in one embodiment, a data processing system includes an interconnect, a plurality of processing nodes coupled to the interconnect, and a fabric controller configured to, responsive to receiving via the interconnect a plurality of messages from the plurality of processing nodes, store, via a buffer, at least a first message of the plurality of messages and a second message of the plurality of messages. The fabric controller is further configured to determine at least one of that a third message of the plurality of messages is associated with a higher priority than a priority associated the first message and that a first amount of time has transpired that exceeds a first expiration associated with the first message. The fabric controller is further configured to store, via displacing the first message from the buffer, the third message in the buffer in response to the determination and transmit the first, second and third messages to at least one processor unit.

While the present invention has been particularly shown as described with reference to one or more preferred embodiments, it will be understood by those skilled in the art that various changes in form and detail may be made therein without departing from the spirit and scope of the invention.

What is claimed is:

1. A data processing system, comprising:
   an interconnect;
   a plurality of processing nodes coupled to the interconnect, wherein the plurality of processing nodes includes a first processing node including a first scheduler and a second processing node including a second scheduler; and
   wherein the first scheduler is configured to:
      send, via the interconnect, a first rate master command to at least one of the plurality of processing nodes;
      determine that a first message is received, wherein the first message indicates that the first rate master command was dropped;
      determine that a count, associated with dropped commands, satisfies a threshold; and
      provide, to the plurality of processing nodes via the interconnect, a signal indicating a command rate to be utilized by each of the plurality of processing nodes, in response to determining that the count satisfies the threshold;
   wherein the second scheduler is configured to detect the signal indicating the command rate, and in response thereto, cause the second processing node to utilize the command rate.

2. The data processing system of claim 1, wherein the first scheduler is further configured to increment the count, associated with the dropped commands, in response to determining that the first message is received.

3. The data processing system of claim 1, wherein the signal provided to the plurality of processing nodes is an out-of-band signal indicating the command rate.

4. The data processing system of claim 1, wherein the first scheduler is further configured to:
   send, via the interconnect, a second rate master command to the at least one of the plurality of processing nodes;
   determine that a second message indicating the second rate master command was dropped, is not received; and
   reset the signal indicating the command rate.

5. The data processing system of claim 4, wherein the first scheduler is further configured to reset the count, associated with the dropped commands, in response to determining that the second message is not received.

6. The data processing system of claim 1, wherein the interconnect, plurality of processing nodes, and first scheduler together form a symmetric multiprocessor data processing system.

7. The data processing system of claim 1, wherein the plurality of processing nodes is only a subset of all processing nodes within the data processing system.

8. The data processing system of claim 1, wherein the plurality of processing nodes comprises all processing nodes within the data processing system.

9. A scheduler configured to be coupled to a plurality of processing nodes of a data processing system via an interconnect that couples the plurality of processing nodes and configured to:
   send, via the interconnect, a first rate master command to at least one of the plurality of processing nodes;
   determine that a first message is received, wherein the first message indicates that the first rate master command was dropped;
   determine that a count, associated with dropped commands, satisfies a threshold; and
   provide, to respective schedulers in each of the plurality of processing nodes via the interconnect, a signal indicating a command rate to be utilized by each of the plurality of processing nodes, in response to determining that the count satisfies the threshold.

10. The scheduler of claim 9, wherein the scheduler is further configured to increment the count, associated with the dropped commands, in response to determining that the first message is received.

11. The scheduler of claim 9, wherein the signal provided to the plurality of processing nodes is an out-of-band signal indicating the command rate.

12. The scheduler of claim 9, wherein the scheduler is further configured to:
   send, via the interconnect, a second rate master command to the at least one of the plurality of processing nodes via the interconnect;
   determine that a second message indicating the second rate master command was dropped, is not received; and
   reset the signal indicating the command rate.

13. The scheduler of claim 12, wherein the first scheduler is further configured to reset the count, associated with the dropped commands, in response to determining that the second message is not received.

14. The scheduler of claim 9, wherein the plurality of processing nodes for which the command rate is indicated by the signal is only a subset of all processing nodes within the data processing system.

15. The scheduler of claim 9, wherein the plurality of processing nodes for which the command rate is indicated by the signal comprises all processing nodes within the data processing system.

* * * * *